(12) United States Patent
Toshiyuki et al.

(10) Patent No.: US 10,483,853 B2
(45) Date of Patent: Nov. 19, 2019

(54) DC-DC CONVERTER

(71) Applicant: TOYOTA JIDOSHA KABUSHIKI KAISHA, Toyota-shi, Aichi (JP)

(72) Inventors: Ken Toshiyuki, Nisshin (JP); Masaki Okamura, Nisshin (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/134,527

(22) Filed: Sep. 18, 2018

(65) Prior Publication Data

US 2019/0089253 A1    Mar. 21, 2019

(30) Foreign Application Priority Data

Sep. 20, 2017   (JP) .................................. 2017-180552

(51) Int. Cl.

| | | |
|---|---|---|
| *G05F 1/70* | (2006.01) | |
| *H02M 3/158* | (2006.01) | |
| *G05F 1/565* | (2006.01) | |
| *H02M 1/088* | (2006.01) | |
| *H03K 17/687* | (2006.01) | |
| *H03K 17/06* | (2006.01) | |
| *H02M 1/00* | (2006.01) | |

(52) U.S. Cl.
CPC .......... *H02M 3/1588* (2013.01); *G05F 1/565* (2013.01); *H02M 1/088* (2013.01); *H02M 3/1584* (2013.01); *H03K 17/063* (2013.01); *H03K 17/687* (2013.01); *H02M 2001/0048* (2013.01); *H02M 2001/0054* (2013.01); *H02M 2003/1586* (2013.01)

(58) Field of Classification Search
CPC .. H02M 1/4233; H02M 3/157; H02M 3/1584; H03K 17/687; G05F 1/565; Y02B 70/126
USPC .... 323/207, 225, 222, 271, 272; 363/17, 65, 363/89, 125, 127
See application file for complete search history.

(56) References Cited

U.S. PATENT DOCUMENTS

| | | | | |
|---|---|---|---|---|
| 6,611,130 B2* | 8/2003 | Chang | ................. | H02M 1/4208 323/225 |
| 7,151,364 B2* | 12/2006 | Kimura | ............... | H02M 3/1584 323/282 |
| 7,760,525 B2* | 7/2010 | Sutardja | ................ | H02M 3/157 363/21.12 |

(Continued)

FOREIGN PATENT DOCUMENTS

JP    2001-186768 A    7/2001

*Primary Examiner* — Rajnikant B Patel
(74) *Attorney, Agent, or Firm* — Hunton Andrews Kurth LLP

(57) ABSTRACT

A DC-DC converter may include a first lower FET and a first upper FET connected in series between a high potential output wiring and a low potential wiring, and a second lower FET and a second upper FET connected in series between the high potential output wiring and the low potential wiring. Diodes may be connected to the upper FETs in parallel. A main reactor may be connected to the high potential input wiring. A first sub-reactor may be connected between the main reactor and the first lower FET. A second sub-reactor may be connected between the main reactor and the second lower FET. The first upper FET and the second upper FET are not turned on during a zero-cross mode.

4 Claims, 16 Drawing Sheets

(56) References Cited

U.S. PATENT DOCUMENTS

| | | | | |
|---|---|---|---|---|
| 7,872,454 B2* | 1/2011 | Sutardja | ............... | H02M 3/157 |
| | | | | 323/222 |
| 7,919,953 B2* | 4/2011 | Porter | ..................... | G05F 5/00 |
| | | | | 323/222 |
| 8,432,138 B2* | 4/2013 | Chen | .................. | H02M 1/4233 |
| | | | | 323/207 |
| 8,513,932 B2* | 8/2013 | Yang | .................. | H02M 3/1584 |
| | | | | 323/282 |

\* cited by examiner

DC-DC CONVERTER

INCORPORATION BY REFERENCE

The disclosure of Japanese Patent Application No. 2017-180552 filed on Sep. 20, 2017, including the specification, drawings and abstract is incorporated herein by reference in its entirety.

TECHNICAL FIELD

The technology disclosed herein relates to a DC-DC converter.

BACKGROUND

Japanese Patent Application Publication No. 2001-186768 describes a DC-DC converter that boosts a voltage supplied from a direct current source and outputs the boosted voltage. This DC-DC converter includes two lower FETs (field effect transistors) of n-channel type, and a source of each of the lower FETs is connected to a low potential wiring. A drain of the first lower FET is connected to a high potential output wiring via a first diode. A drain of the second lower FET is connected to the high potential output wiring via a second diode. Moreover, this DC-DC converter has a main reactor, a first sub-reactor, and a second sub-reactor. The main reactor includes a first terminal and a second terminal. The first terminal of the main reactor is connected to a diode bridge (a type of direct current source) via a high potential input wiring. One end of the first sub-reactor is connected to the second terminal of the main reactor, and other end of the first sub-reactor is connected to the drain of the first lower FET. One end of the second sub-reactor is connected to the second terminal of the main reactor, and other end of the second sub-reactor is connected to the drain of the second lower FET. The first and second lower FETs are controlled to be turned on alternately. A current flows through the first diode when the first lower FET is switched from on to off, and a current flows through the second diode when the second lower FET is switched from on to off. Consequently, a high voltage is outputted to the high potential output wiring. Moreover, controlling the first and second lower FETs as such reduces a switching loss that occurs in the first and second lower FETs.

SUMMARY

To reduce a current flowing through the first diode, a FET of n-channel type (hereinafter referred to as a first upper FET) that is connected in parallel to the first diode may be provided. Moreover, to reduce a current flowing through the second diode, a FET of n-channel type (hereinafter referred to as a second upper FET) that is connected in parallel to the second diode may be provided. By turning on the first upper FET in accordance with a timing at which a current flows through the first diode, the current is divided, so a loss to be caused can be reduced. Similarly, by turning on the second upper FET in accordance with a timing at which a current flows through the second diode, the current is divided, so a loss to be caused can be reduced. In such a DC-DC converter, while a current flows toward the high potential wiring via the first upper FET, an induced voltage of the main reactor decreases and the current flowing through the first upper FET gradually decreases. If the current flowing through the first upper FET is small, the current may decrease below zero and flow through the first upper FET in a reverse direction. Similarly, if the current flowing through the second upper FET is small, the current may decrease below zero and flow through the second upper FET in a reverse direction. When the currents flow through the first and second upper FETs in the reverse directions, a loss occurs. The disclosure herein proposes a technology that suppresses a loss by preventing a current from flowing through first and second upper FETs in a reverse direction.

A DC-DC converter disclosed herein may comprise: a high potential input wiring connected to a positive electrode of a direct current source; a high potential output wiring; a low potential wiring connected to a negative electrode of the direct current source; a first lower FET of n-channel type, a source of the first lower FET being connected to the low potential wiring; a first upper FET of n-channel type, a source of the first upper FET being connected to a drain of the first lower FET, and a drain of the first upper FET being connected to the high potential output wiring; a second lower FET of n-channel type, a source of the second lower FET being connected to the low potential wiring; a second upper FET of n-channel type, a source of the second upper FET being connected to a drain of the second lower FET, and a drain of the second upper FET being connected to the high potential output wiring; a first diode, an anode of the first diode being connected to the source of the first upper FET, and a cathode of the first diode being connected to the drain of the first upper FET; a second diode, an anode of the second diode being connected to the source of the second upper FET, and a cathode of the second diode being connected to the drain of the second upper FET; a main reactor comprising a first terminal and a second terminal, the first terminal being connected to the high potential input wiring; a first sub-reactor, one end of the first sub-reactor being connected to the second terminal of the main reactor, and other end of the first sub-reactor being connected to the drain of the first lower FET; a second sub-reactor, one end of the second sub-reactor being connected to the second terminal of the main reactor, and other end of the second sub-reactor being connected to the drain of the second lower FET; and a gate controller connected to a gate of the first lower FET, a gate of the first upper FET, a gate of the second lower FET, and a gate of the second upper FET. The gate controller may be configured to perform a first operation and a second operation based on a variable current flowing through the main reactor, the gate controller may be configured to perform the first operation during a zero-cross mode in which the variable current decreases to zero, and to perform the second operation during a non-zero-cross mode in which the variable current does not decrease to zero. In the first operation, the gate controller may control the first lower FET, the first upper FET, the second lower FET, and the second upper FET so as to satisfy following conditions: (condition 1) a first state, a second state, a third state, and a fourth state repeatedly appear in this order, the first state being a state in which the first lower FET is on, the second state being a state in which the first lower FET and the second lower FET are off, the third state being a state in which the second lower FET is on, and the fourth state being a state in which the first lower FET and the second lower FET are off; and (condition 2) the first upper FET and the second upper FET are not turned on. In the second operation, the gate controller may control the first lower FET, the first upper FET, the second lower FET, and the second upper FET so as to satisfy following conditions: (condition 3) a fifth state, a sixth state, a seventh state, and an eighth state repeatedly appear in this order, the fifth state being a state in which the first lower FET is on and the second lower FET is off, the sixth state being a state in which the first lower FET and the second lower FET are off, the seventh state being a state in which the first lower FET is off and the second lower FET is on, and the eighth state being a state in which the first lower FET and the second lower FET are off; and (condition 4) the first upper FET is turned on in at least a part of a period of the sixth state, and the second upper FET is turned on in at least a part of a period of the eighth state.

It should be noted that the first operation may be constantly performed during the zero-cross mode, or may be performed in a part of a period during the zero-cross mode. Moreover, the second operation may be constantly performed during the non-zero-cross mode, or may be performed in a part of a period during the non-zero-cross mode.

In this DC-DC converter, the second operation is performed during the non-zero-cross mode. Since the first upper FET is turned on in at least a part of the period of the sixth state in the second operation, a current is divided to flow through the first diode and the first upper FET, so a loss is reduced. Similarly, since the second upper FET is turned on in at least a part of the period of the eighth state in the second operation, a current is divided to flow through the second diode and the second upper FET, so a loss is reduced. Moreover, during the non-zero-cross mode, the variable current does not decrease to zero. Accordingly, even if the first and second upper FETs are turned on, no current flows through these upper FETs in a reverse direction.

Moreover, in the DC-DC converter, the first operation is performed during the zero-cross mode. In the first operation, the variable current decreases to zero. In the first operation, however, the first and second upper FETs are not turned on. Therefore, a current is prevented from flowing through the first and second upper FETs in a reverse direction. It is therefore possible to prevent a loss caused by the current flowing through the first and second upper FETs in the reverse direction. Moreover, the variable current is small during the zero-cross mode, and hence a current flowing through the first diode or the second diode is small. Therefore, a loss that occurs in the diode is small even if a current is not divided to the diode and the upper FET.

As described above, in the DC-DC converter, during the zero-cross mode, the first operation prevents a current from flowing through each upper FET in a reverse direction, so a loss caused by a reverse current can be prevented. Moreover, in the DC-DC converter, during the non-zero-cross mode, no current flows through each upper FET in a reverse direction, so a current flowing through each diode is divided by turning on the corresponding upper FET and a loss can be reduced. Therefore, a loss can be reduced both during the zero-cross mode and during the non-zero-cross mode.

DETAILED DESCRIPTION

First Embodiment

Figure 1:
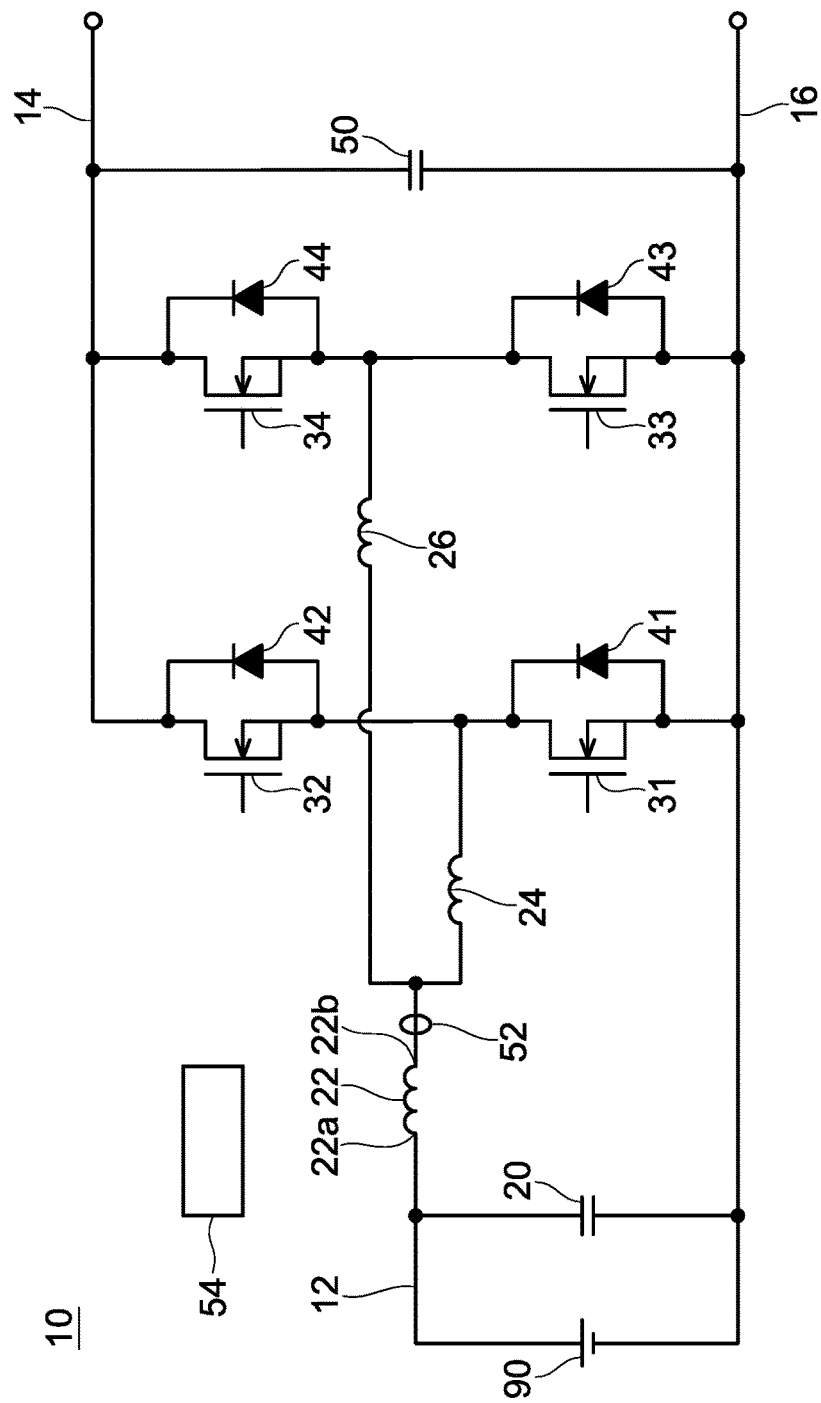
FIG. 1 is a circuit diagram of a DC-DC converter.

FIG. 1 illustrates a circuit diagram of a DC-DC converter 10 according to an embodiment. The DC-DC converter 10 is mounted on a vehicle. The DC-DC converter 10 comprises a high potential input wiring 12, a high potential output wiring 14, and a low potential wiring 16. The high potential input wiring 12 is connected to a positive electrode of a direct current source 90 (e.g., a battery). The low potential wiring 16 is connected to a negative electrode of the direct current source 90. The DC-DC converter 10 boosts an applied voltage of the direct current source 90 (i.e., a voltage between the high potential input wiring 12 and the low potential wiring 16), and applies the boosted voltage between the high potential output wiring 14 and the low potential wiring 16. Although not illustrated, a load (e.g., an inverter or a drive motor) is connected between the high potential output wiring 14 and the low potential wiring 16. Therefore, the boosted voltage is supplied to the load.

The DC-DC converter 10 comprises an input-side smoothing capacitor 20, a main reactor 22, a first sub-reactor 24, a second sub-reactor 26, MOSFETs 31 to 34, diodes 41 to 44, an output-side smoothing capacitor 50, a current sensor 52, and a gate controller 54.

The input-side smoothing capacitor 20 is connected between the high potential input wiring 12 and the low potential wiring 16.

Each of the MOSFETs 31, 32, 33, 34 is a MOSFET of n-channel type. The MOSFET 31 and the MOSFET 32 are connected in series between the high potential output wiring 14 and the low potential wiring 16. A source of the MOSFET 31 is connected to the low potential wiring 16. A drain of the MOSFET 31 is connected to a source of the MOSFET 32. A drain of the MOSFET 32 is connected to the high potential output wiring 14. The diode 41 is connected in parallel to the MOSFET 31. An anode of the diode 41 is connected to the source of the MOSFET 31. A cathode of the diode 41 is connected to the drain of the MOSFET 31. The diode 42 is connected in parallel to the MOSFET 32. An anode of the diode 42 is connected to the source of the MOSFET 32. A cathode of the diode 42 is connected to the drain of the MOSFET 32.

The MOSFET 33 and the MOSFET 34 are connected in series between the high potential output wiring 14 and the low potential wiring 16. A source of the MOSFET 33 is connected to the low potential wiring 16. A drain of the MOSFET 33 is connected to a source of the MOSFET 34. A drain of the MOSFET 34 is connected to the high potential output wiring 14. The diode 43 is connected in parallel to the MOSFET 33. An anode of the diode 43 is connected to the source of the MOSFET 33. A cathode of the diode 43 is connected to the drain of the MOSFET 33. The diode 44 is connected in parallel to the MOSFET 34. An anode of the diode 44 is connected the source of the MOSFET 34. A cathode of the diode 44 is connected to the drain of the MOSFET 34.

It should be noted that a MOSFET that has its source connected to the low potential wiring 16 (i.e., the MOSFETs 31, 33) will hereinafter be referred to as a lower MOSFET, and a MOSFET that has its drain connected to the high potential output wiring 14 (i.e., the MOSFETs 32, 34) will hereinafter be referred to as an upper MOSFET.

The main reactor 22 includes a first terminal 22a and a second terminal 22b. The first terminal 22a is connected to the high potential input wiring 12. The main reactor 22 includes a structure in which a wire is wound plural times around a core constituted of a high magnetic permeability material.

One end of the first sub-reactor 24 is connected to the second terminal 22b of the main reactor 22. Other end of the first sub-reactor 24 is connected to the drain of the lower MOSFET 31 and the source of the upper MOSFET 32. An inductance of the first sub-reactor 24 is smaller than an inductance of the main reactor 22.

One end of the second sub-reactor 26 is connected to the second terminal 22b of the main reactor 22. Other end of the second sub-reactor 26 is connected to the drain of the lower MOSFET 33 and the source of the upper MOSFET 34. An inductance of the second sub-reactor 26 is smaller than the inductance of the main reactor 22.

It should be noted that each of the first sub-reactor 24 and the second sub-reactor 26 may include a structure in which a wire is wound around a core, or may include a structure in which a high magnetic permeability material covers a wiring.

The output-side smoothing capacitor 50 is connected between the high potential output wiring 14 and the low potential wiring 16.

The current sensor 52 detects a current flowing through the main reactor 22. The current sensor 52 transmits a value of the detected current to the gate controller 54.

The gate controller 54 is connected to each of gates of the MOSFETs 31 to 34. The gate controller 54 includes, for each MOSFET, a driving circuit that charges/discharges the corresponding gate. Moreover, the gate controller 54 includes a control circuit that transmits a signal for instructing each driving circuit to turn on or turn off the corresponding MOSFET. The gate controller 54 can control the MOSFETs 31 to 34 independently.

Figure 2:
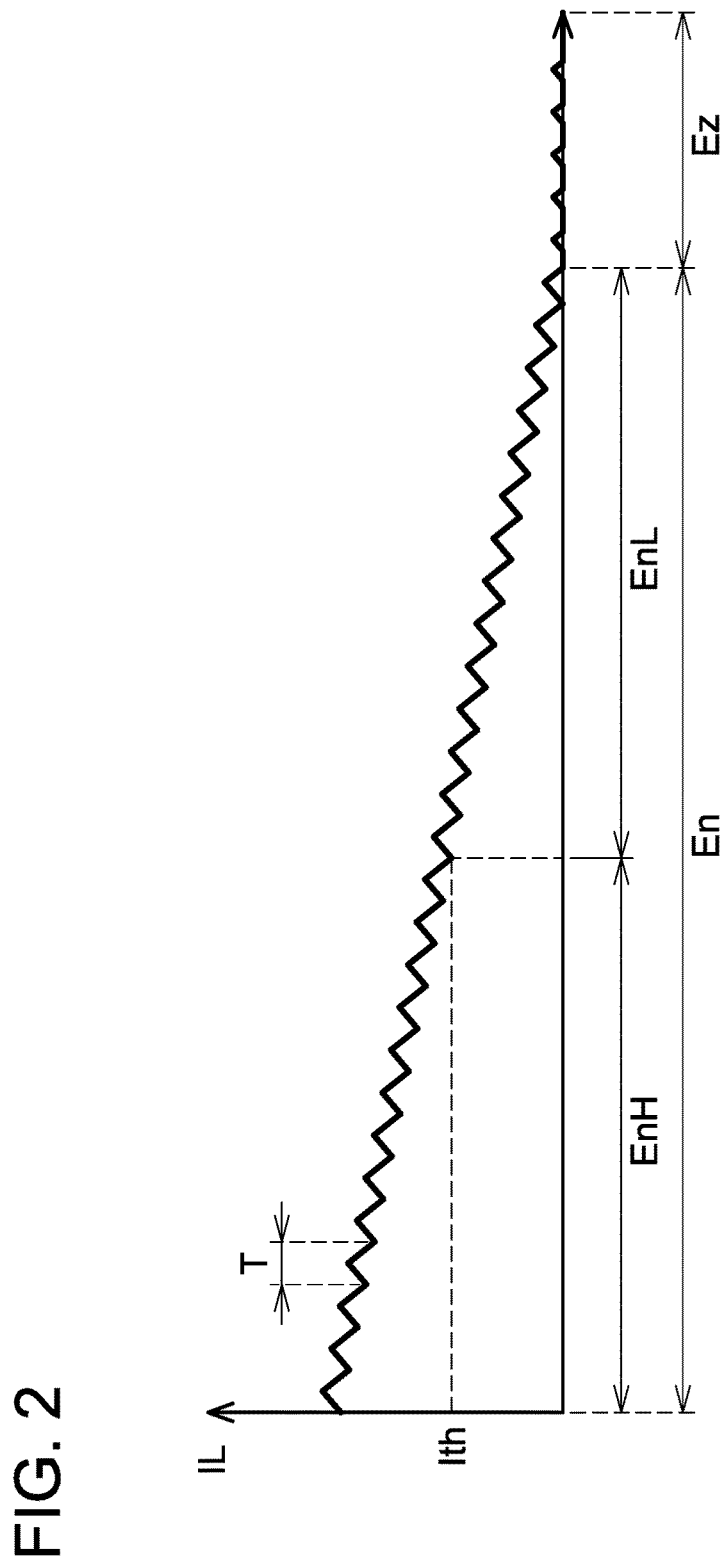
FIG. 2 is an explanatory diagram of a zero-cross mode, a low-current mode, and a high-current mode.

Next, an operation of the DC-DC converter 10 will be described. FIG. 2 illustrates changes in a current IL flowing through the main reactor 22 relative to time. The current IL periodically fluctuates by the MOSFETs 31 to 34 being switched. Moreover, the current IL fluctuates over a long term due to power consumption and the like in the load (i.e., the drive motor or the like). FIG. 2 illustrates a case where the current IL gradually decreases while periodically fluctuating. It should be noted, although FIG. 2 illustrates a fluctuation cycle T of the current IL as being relatively long, the fluctuation cycle T is actually much shorter than that in FIG. 2. In FIG. 2, the current IL in a period Ez is in a zero-cross mode, and the current IL in a period En is in a non-zero-cross mode. The zero-cross mode is an operation state in which the current IL becomes zero in a part of the fluctuation cycle T of the current IL. The non-zero-cross mode is an operation state in which the current IL does not become zero during the fluctuation cycle T of the current IL. When power consumption in the load (i.e., the drive motor or the like) is small, the current IL decreases and the zero-cross mode starts. Moreover, in FIG. 2, the current IL in a period EnL is in a low-current mode, and the current IL in a period EnH is in a high-current mode. The low-current mode is an operation state in which the current IL becomes lower than a threshold value Ith in at least a part of the fluctuation cycle T. The high-current mode is an operation state in which the current IL is constantly equal to or higher than the threshold value Ith during the fluctuation cycle T. FIG. 2 illustrates a case where the current IL gradually decreases with a lapse of time and illustrates how the current IL changes from the high-current mode (EnH) to the low-current mode (EnL) and the zero-cross mode (Ez) in this order. The gate controller 54 can perform a first operation, a second operation, and a third operation. The gate controller 54 switches between the first, second, and third operations according to the current IL detected by the current sensor 52 (the current flowing through the main reactor 22). The gate controller 54 performs the third operation during the high-current mode, performs the second operation during the low-current mode, and performs the first operation during the zero-cross mode.

Figure 3:
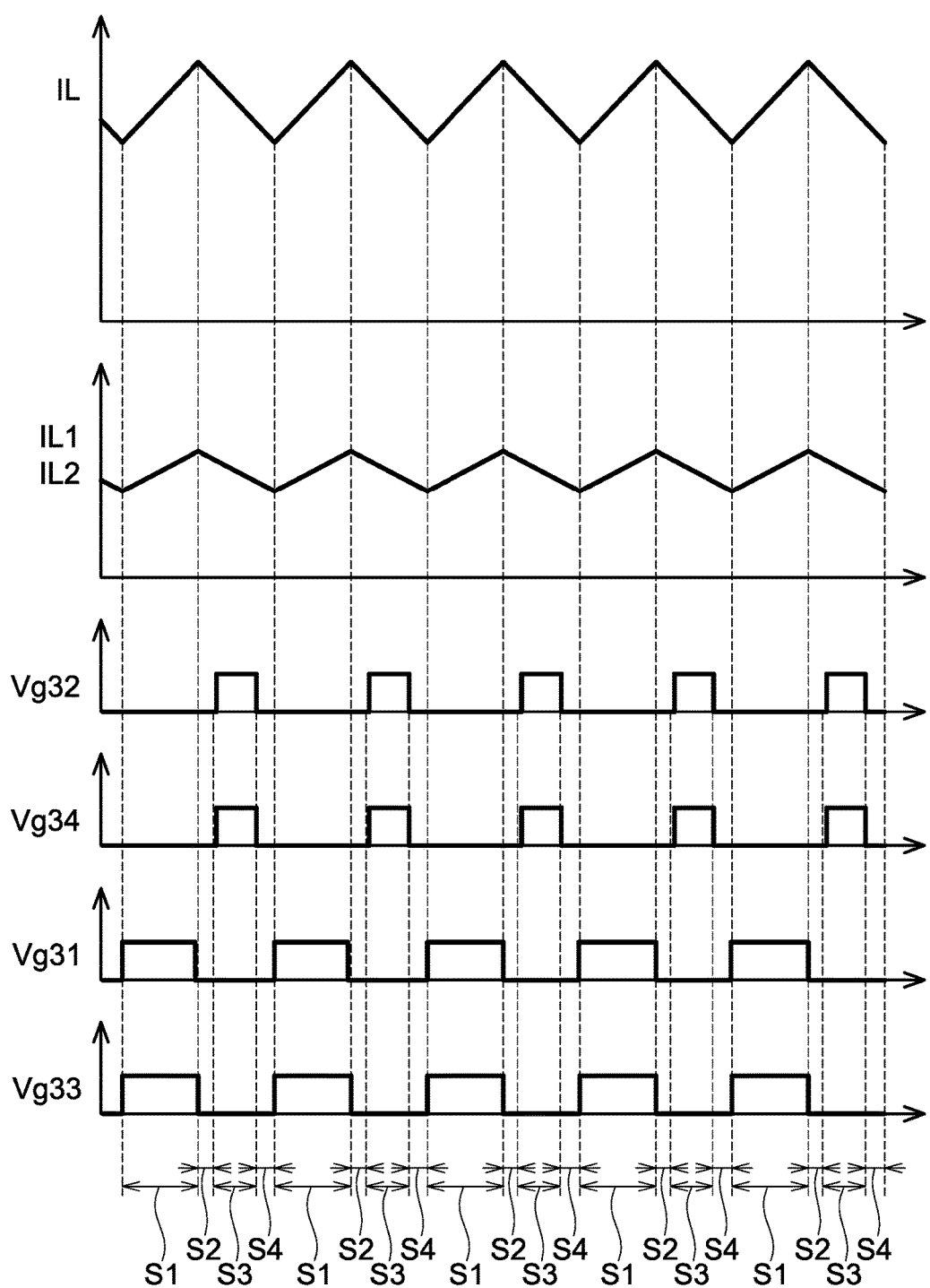
FIG. 3 is a graph illustrating changes in respective values in a third operation.
Figure 4:
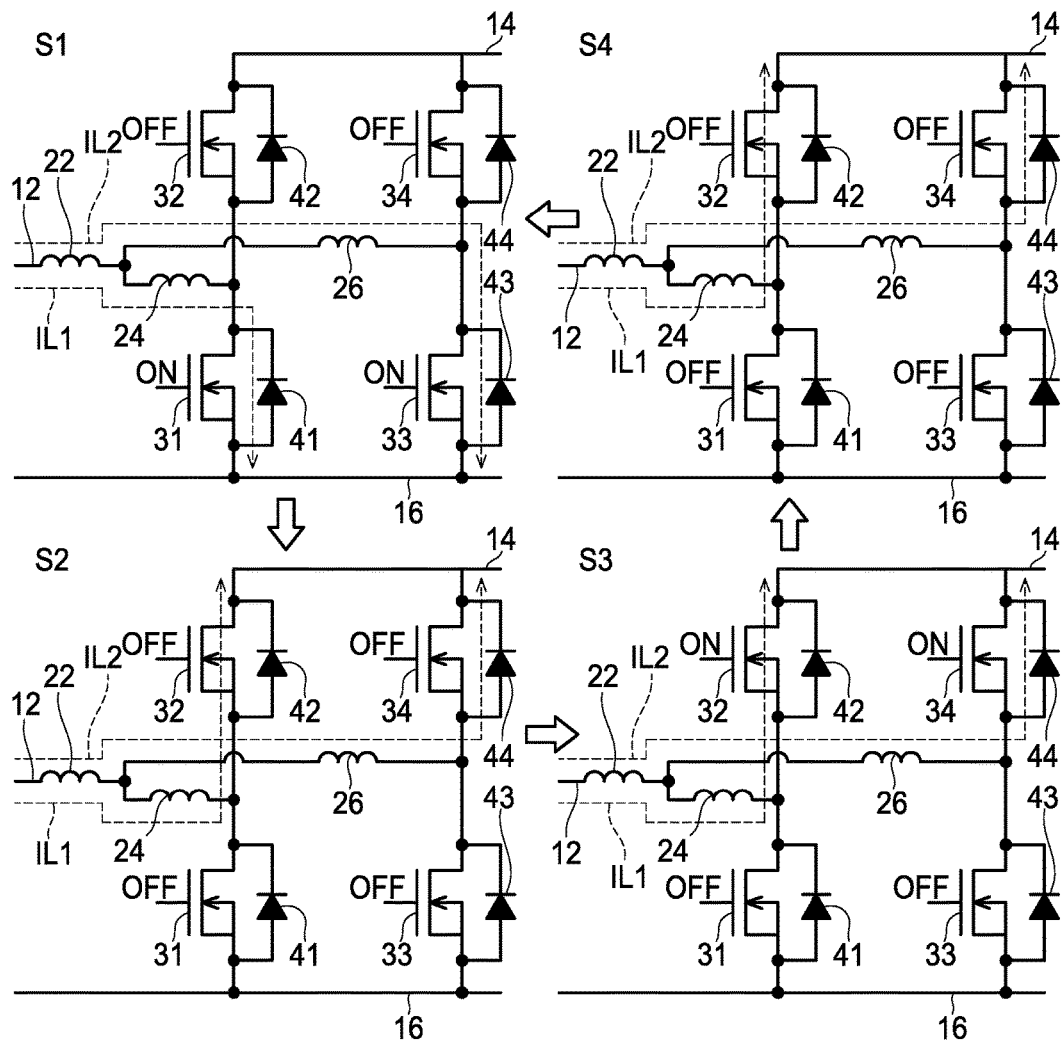
FIG. 4 is a diagram illustrating changes in a state of the DC-DC converter in the third operation.

Initially, the third operation will be described. FIG. 3 is a graph illustrating changes in respective values in the third operation. It should be noted, in FIG. 3 and the subsequent drawings, the current IL is a current flowing through the main reactor 22, a current IL1 is a current flowing through the first sub-reactor 24, and a current IL2 is a current flowing through the second sub-reactor 26. It should also be noted that the current IL represents a total value of the current IL1 and the current IL2. Moreover, in FIG. 3, the current IL1 coincides with the current IL2 (graphs are overlaid). Moreover, in FIG. 3 and the subsequent drawings, a potential Vg31 is a gate potential of the lower MOSFET 31, a potential Vg32 is a gate potential of the upper MOSFET 32, a potential Vg33 is a gate potential of the lower MOSFET 33, and a potential Vg34 is a gate potential of the upper MOSFET 34. The gate potentials Vg31 to Vg34 are controlled by the gate controller 54. The gate potentials Vg31 to Vg34 change between a high potential and a low potential. Each MOSFET is brought into an on state when its gate potential is high and is brought into an off state when its gate potential is low. As illustrated in FIG. 3, in the third operation, the gate controller 54 controls a state of the DC-DC converter 10 so as to be changed from a state S1 to a state S2, a state S3, and a state S4 in this order, and then return to the state S1. In other words, the gate controller 54 performs control such that a cycle of the states S1 to S4 is repeated. FIG. 4 illustrates each of the states S1 to S4. It should be noted that each of FIGS. 4, 6, 8, 10, and 14 illustrates the circuit configuration of the DC-DC converter 10 in a more simplified manner than FIG. 1 does.

In the state S1, the lower MOSFET 31 and the lower MOSFET 33 are on, and the upper MOSFET 32 and the upper MOSFET 34 are off. Accordingly, the current IL1 flows from the high potential input wiring 12 to the low potential wiring 16 through the main reactor 22, the first sub-reactor 24, and the lower MOSFET 31, and additionally, the current IL2 flows from the high potential input wiring 12 to the low potential wiring 16 through the main reactor 22, the second sub-reactor 26, and the lower MOSFET 33. During a period of the state S1, an induced voltage of each reactor (induced voltages that act in a direction opposing the current IL1 and in a direction opposing the current IL2) gradually decreases, and thus the currents ILL IL2 gradually increase. Therefore, the current IL gradually increases. At an end of the period of the state S1, the lower MOSFET 31 and the lower MOSFET 33 are switched from the on state to the off state. The DC-DC converter 10 thereby transitions from the state S1 to the state S2.

When the lower MOSFET 31 and the lower MOSFET 33 are turned off at a start of the state S2, the main reactor 22 and the first sub-reactor 24 generate induced voltages in a direction along which the current IL1 is kept flowing, and the main reactor 22 and the second sub-reactor 26 generate induced voltages in a direction along which the current IL2 is kept flowing. The induced voltages generated by the main reactor 22 and the first sub-reactor 24 raise a potential of the anode of the diode 42, so the current IL1 flows through the diode 42. In other words, the current IL1 flows from the high potential input wiring 12 to the high potential output wiring 14 through the main reactor 22, the first sub-reactor 24, and the diode 42. Moreover, the induced voltages generated by the main reactor 22 and the second sub-reactor 26 raise a potential of the anode of the diode 44, so the current IL2 flows through the diode 44. In other words, the current IL2 flows from the high potential input wiring 12 to the high potential output wiring 14 through the main reactor 22, the second sub-reactor 26, and the diode 44. Such flows of the currents ILL IL2 charge the output-side smoothing capacitor 50 (see FIG. 1) and raise a potential of the high potential output wiring 14. At an end of the period of the state S2, the upper MOSFET 32 and the upper MOSFET 34 are switched from the off state to the on state. The DC-DC converter 10 thereby transitions from the state S2 to the state S3.

In the state S3 as well, the current IL1 flows via the diode 42, and the current IL2 flows via the diode 44. Moreover, due to the turn-on of the upper MOSFET 32, the current IL1 divides to flow through the upper MOSFET 32 and the diode 42. Due to this, a loss caused by the current IL1 flowing is reduced. Moreover, due to the turn-on of the upper MOSFET 34, the current IL2 divides to flow through the upper MOSFET 34 and the diode 44. Due to this, a loss caused by the current IL2 flowing is reduced. At an end of a period of the state S3, the upper MOSFET 32 and the upper MOSFET 34 are switched from the on state to the off state. The DC-DC converter 10 thereby transitions from the state S3 to the state S4.

In the state S4 as well, as in the state S2, the current IL1 flows via the diode 42, and the current IL2 flows via the diode 44. At an end of a period of the state S4, the lower MOSFET 31 and the lower MOSFET 33 are switched from the off state to the on state. The DC-DC converter 10 thereby transitions from the state S4 to the state S1.

It should be noted, during the periods of the states S2, S3, and S4, the induced voltage of each reactor (induced voltages that act in a direction along which the current IL1 flows and in a direction along which the current IL2 flows) gradually decreases, so the currents ILL IL2 gradually decrease. In other words, the current IL gradually decreases. Repetition of the states S1 to S4 causes cyclic fluctuations in the current IL.

As described above, in the third operation, the state (the state S1) in which the lower MOSFETs 31, 33 are on and the state (the states S2, S3, S4) in which the lower MOSFETs 31, 33 are off are alternately repeated. The potential of the high potential output wiring 14 can thereby be raised.

Figure 5:
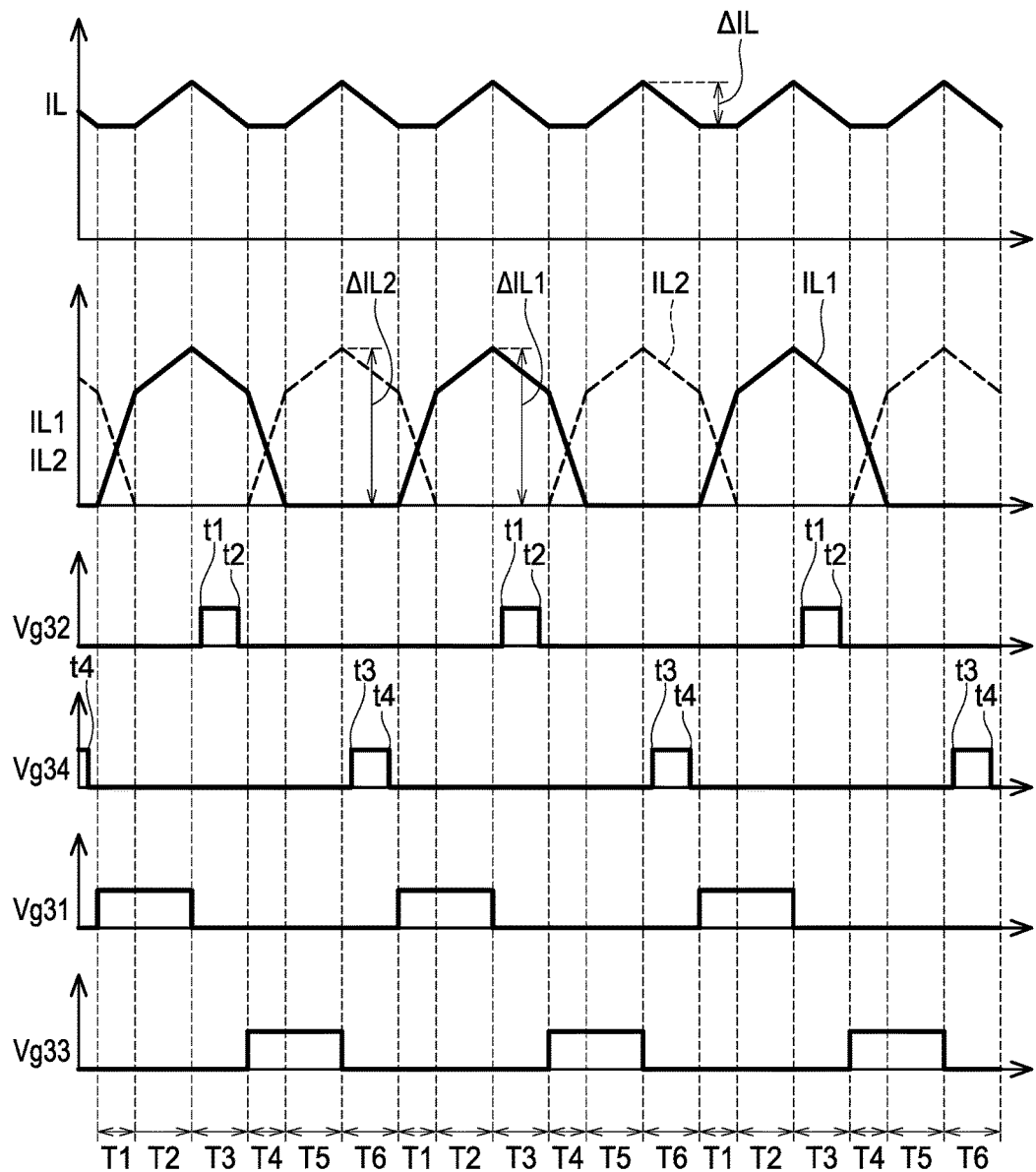
FIG. 5 is a graph illustrating changes in respective values in a second operation.
Figure 6:
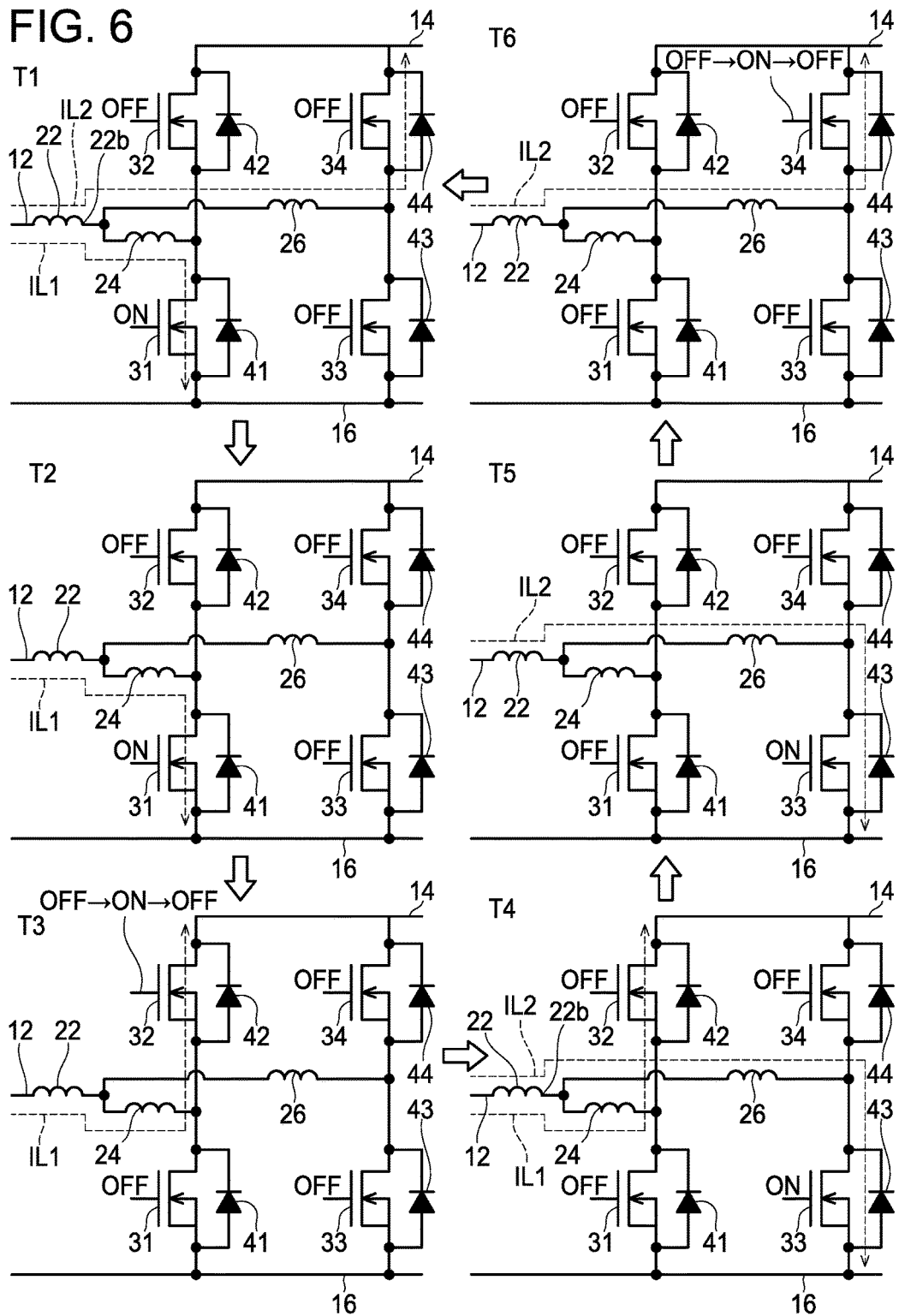
FIG. 6 is a diagram illustrating changes in the state of the DC-DC converter in the second operation.

Next, the second operation will be described. As illustrated in FIG. 2, the second operation is performed in the period EnL (i.e., the low-current mode) in which the current IL is lower than the threshold value Ith. FIG. 5 is a graph illustrating changes in the respective values in the second operation. As illustrated in FIG. 5, in the second operation, the gate controller 54 controls the state of the DC-DC converter 10 so as to be changed from a state T1 to a state T2, a state T3, a state T4, a state T5, and a state T6 in this order, and then return to the state T1. In other words, the gate controller 54 performs control such that a cycle of the states T1 to T6 is repeated. FIG. 6 illustrates each of the states T1 to T6.

As illustrated in FIGS. 5 and 6, in the state T1, the lower MOSFET 31 is on, the upper MOSFET 32 is off, the lower MOSFET 33 is off, and the upper MOSFET 34 is off. Since the lower MOSFET 31 is on in the state T1, the current IL1 flows from the high potential input wiring 12 to the low potential wiring 16 through the main reactor 22, the first sub-reactor 24, and the lower MOSFET 31. During a period of the state T1, the induced voltage of the first sub-reactor 24 (induced voltage that acts in the direction opposing the current IL1) decreases, so the current IL1 rapidly increases during the period of the state T1. Moreover, although described later in detail, in the state T1, the current IL2 flows from the high potential input wiring 12 to the high potential output wiring 14 through the main reactor 22, the second sub-reactor 26, and the diode 44 due to the induced voltage of the second sub-reactor 26. However, the current IL2 rapidly decreases during the period of the state T1. Therefore, the current IL hardly changes during the period of the state T1. When the current IL2 decreases to zero in the state T1, the state T2 starts.

In the state T2, the lower MOSFET 31 is maintained in the on state and the current IL1 continues flowing. During a period of the state T2, the induced voltage of the main reactor 22 and the induced voltage of the first sub-reactor 24 (induced voltages that act in the direction opposing the current IL1) decrease, so the current IL1 gradually increases during the period of the state T2. Accordingly, the current IL also gradually increases. At an end of the period of the state T2, the lower MOSFET 31 is switched form the on state to the off state. The DC-DC converter 10 thereby transitions from the state T2 to the state T3.

At an early stage of a period of the state T3, the upper MOSFET 32 is off. When the lower MOSFET 31 is turned off at a start of the state T3, the main reactor 22 and the first sub-reactor 24 generates induced voltages in the direction along which the current IL1 is kept flowing, so the potential of the anode of the diode 42 rises. Accordingly, the current IL1 flows from the high potential input wiring 12 to the high potential output wiring 14 through the main reactor 22, the first sub-reactor 24, and the diode 42. Such a flow of the current IL1 to the high potential output wiring 14 charges the output-side smoothing capacitor 50 (see FIG. 1) and raises the potential of the high potential output wiring 14. During the period of the state T3, the induced voltages of the main reactor 22 and the first sub-reactor 24 (induced voltages that act in the direction along which the current IL1 flows) decrease, so the current IL1 gradually decreases during the period of the state T3. Accordingly, the current IL also gradually decreases.

In a part of the period of the state T3 (a period between a timing t1 and a timing t2 in FIG. 5), the upper MOSFET 32 is turned on. While the upper MOSFET 32 is on, the current IL1 divides to flow through the diode 42 and the upper MOSFET 32. Due to this, a current density of the diode 42 is decreased, and a loss caused by the current IL1 is reduced. More specifically, a loss that occurs in the diode 42 and the upper MOSFET 32 when the current IL1 divides to flow through the diode 42 and the upper MOSFET 32 is smaller than a loss that occurs in the diode 42 when the current IL1 flows through the diode 42 with the upper MOSFET 32 being off. As such, by turning on the upper MOSFET 32 when the current IL1 flows through the diode 42, a loss can be reduced. Especially in a case of using a body diode of the upper MOSFET 32 (a diode constituted of a pn junction at an interface between an n-type semiconductor region on a source side of the MOSFET and a p-type semiconductor region that constitutes a channel layer) as the diode 42, the current density of the diode 42 is likely to become high. Accordingly, by decreasing the current density of the diode 42 by turning on the upper MOSFET 32, a loss can be effectively reduced. At an end of the period of the state T3, the lower MOSFET 33 is switched from the off state to the on state. The DC-DC converter 10 thereby transitions from the state T3 to the state T4.

The lower MOSFET 33 is on in the state T4, so the current IL2 flows from the high potential input wiring 12 to the low potential wiring 16 through the main reactor 22, the second sub-reactor 26, and the lower MOSFET 33. During a period of the state T4, the induced voltage generated by the second sub-reactor 26 (induced voltage that acts in the direction opposing the current IL2) decreases, so the current IL2 rapidly increases during the period of the state T4. Moreover, during the period of the state T4, the current IL1 continues flowing via the diode 42 as in the period of the state T3. However, in the period of the state T4, a potential of the second terminal 22b of the main reactor 22 rapidly decreases by the turn-on of the lower MOSFET 33, so the current IL1 rapidly decreases. Therefore, in the state T4, the current IL hardly changes. When the current IL1 decreases to zero, the state T5 starts.

In the state T5, the lower MOSFET 33 is maintained in the on state, and the current IL2 continues flowing. During a period of the state T5, the induced voltage of the main reactor 22 and the induced voltage of the second sub-reactor 26 (induced voltages that act in the direction opposing the current IL2) decrease, so the current IL2 gradually increases during the period of the state T5. Accordingly, the current IL also gradually increases. At an end of the period of the state T5, the lower MOSFET 33 is switched from the on state to the off state. The DC-DC converter 10 thereby transitions from the state T5 to the state T6.

At an early stage of a period of the state T6, the upper MOSFET 34 is off. When the lower MOSFET 33 is turned off at a start of the state T6, the main reactor 22 and the second sub-reactor 26 generate induced voltages in a direction along which the current IL2 is kept flowing, so the potential of the anode of the diode 44 rises. Accordingly, the current IL2 flows from the high potential input wiring 12 to the high potential output wiring 14 through the main reactor 22, the second sub-reactor 26, and the diode 44. Such a flow of the current IL2 to the high potential output wiring 14 charges the output-side smoothing capacitor 50 (see FIG. 1) and raises the potential of the high potential output wiring 14. During the period of the state T6, the induced voltages of the main reactor 22 and the second sub-reactor 26 (induced voltages that act in the direction along which the current IL2 flows) decrease, so the current IL2 gradually decreases during the period of the state T6. Accordingly, the current IL also gradually decreases.

In a part of the period of the state T6 (a period between a timing t3 and a timing t4 in FIG. 5), the upper MOSFET 34 is turned on. While the upper MOSFET 34 is on, the current IL2 divides to flow through the diode 44 and the upper MOSFET 34. Due to this, a current density of the diode 44 decreases, and a loss caused by the current IL2 reduces. More specifically, a loss that occurs in the diode 44 and the upper MOSFET 34 when the current IL2 divides to flow through the diode 44 and the upper MOSFET 34 is smaller than a loss that occurs in the diode 44 when the current IL2 flows through the diode 44 with the upper MOSFET 34 being off. As such, by turning on the upper MOSFET 34 when the current IL2 flows through the diode 44, a loss can be reduced. Especially in a case of using a body diode of the upper MOSFET 34 as the diode 44, the current density of the diode 44 is likely to be high. Accordingly, by decreasing the current density of the diode 44 by turning on the upper MOSFET 34, a loss can be effectively reduced. At an end of the period of the state T6, the lower MOSFET 31 is switched from the off state to the on state. The DC-DC converter 10 thereby transitions from the state T6 to the aforementioned state T1.

When the DC-DC converter 10 returns to the state T1, the current IL1 flows through the lower MOSFET 31 as aforementioned. The current IL1 rapidly increases. Moreover, during the period of the state T1, the current IL2 continues flowing via the diode 44 as in the period of the state T6. However, in the period of the state T1, the potential of the second terminal 22b of the main reactor 22 rapidly decreases due to the turn-on of the lower MOSFET 31, so the current IL2 rapidly decreases. Therefore, in the state T1, the current IL hardly changes.

As described above, in the second operation, the cycle of the states T1 to T6 is repeated plural times. The potential of the high potential output wiring 14 can thereby be raised.

It should be noted, in the aforementioned second operation, the upper MOSFET 32 is turned on in a part of the period of the state T3, and the upper MOSFET 34 is turned on in a part of the period of the state T6. However, as long as no short circuit occurs between the high potential output wiring 14 and the low potential wiring 16, the upper MOSFET 32 may be on in the entire period of the state T3, and the upper MOSFET 34 may be on in the entire period of the state T6. Moreover, periods during which the respective upper MOSFETs 32, 34 are on may be extended as compared to those in the aforementioned second operation. For example, the upper MOSFET 32 may be on from a certain point in the period of the state T3 to a certain point in the period of the state T4. Moreover, for example, the upper MOSFET 34 may be on from a certain point in the period of the state T6 to a certain point in the period of the state T1.

Figure 7:
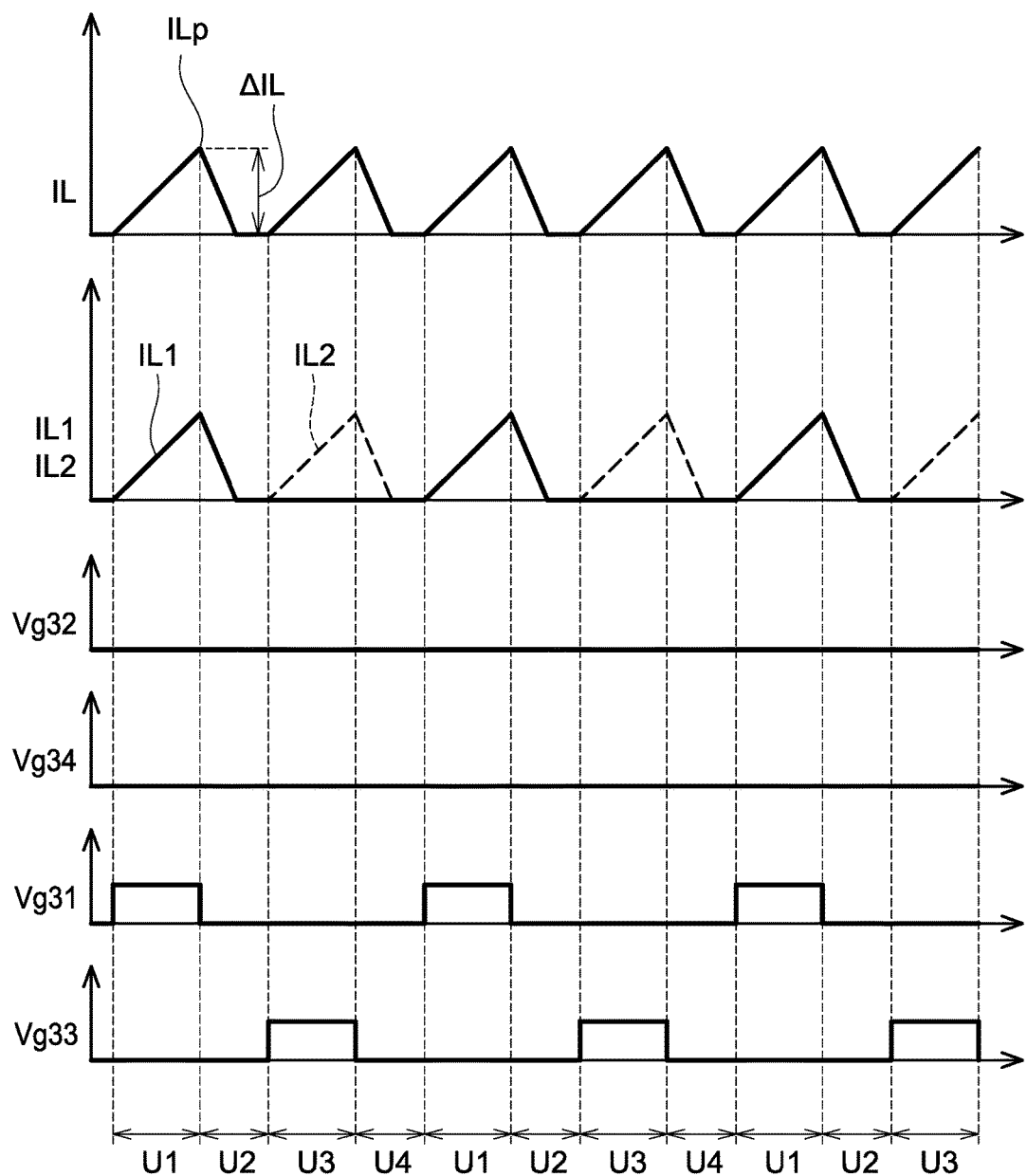
FIG. 7 is a graph illustrating changes in respective values in a first operation.
Figure 8:
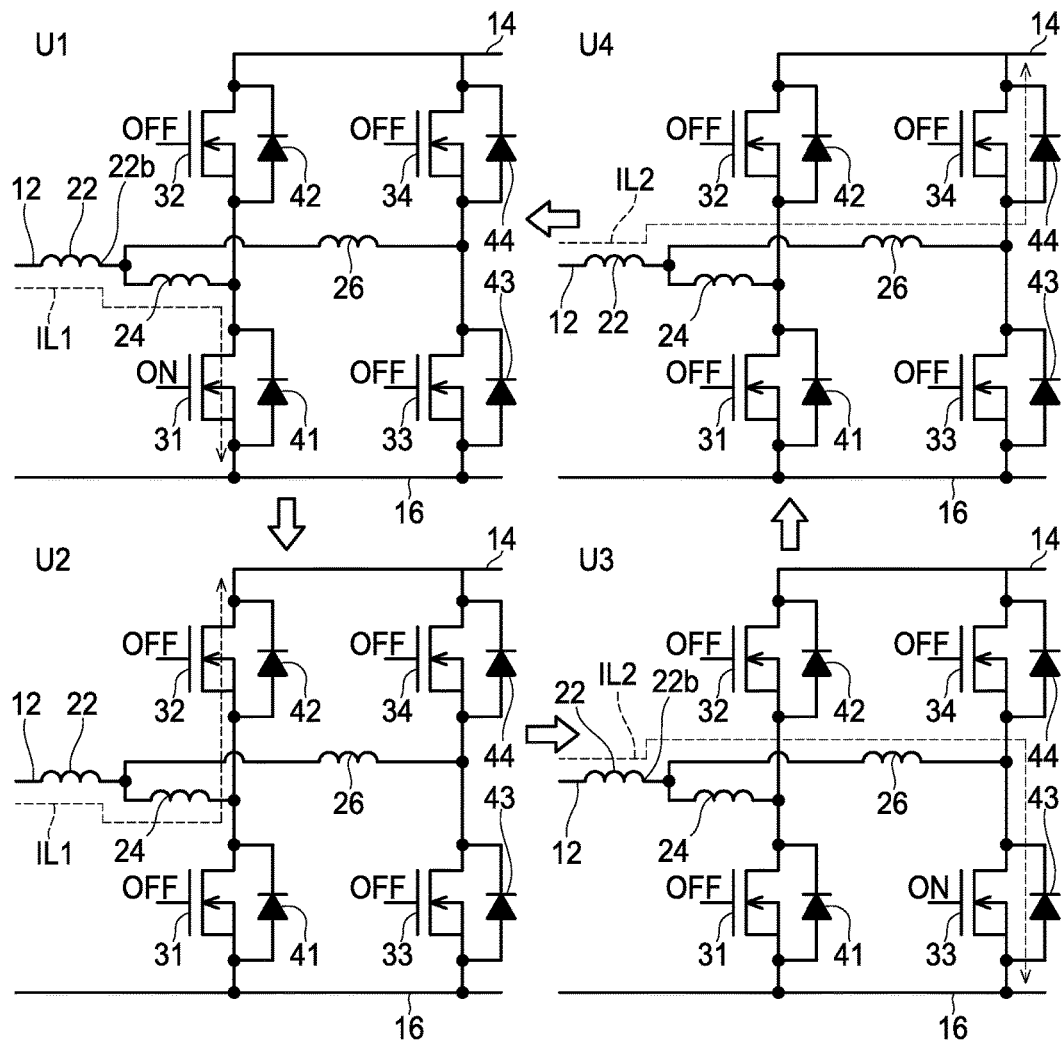
FIG. 8 is a diagram illustrating changes in the state of the DC-DC converter in the first operation.

Next, the first operation will be described. As illustrated in FIG. 2, when the current IL decreases and enters the zero-cross mode (i.e., the period Ez), the first operation is performed. FIG. 7 is a graph illustrating changes in the respective values in the first operation. As illustrated in FIG. 7, in the first operation, the gate controller 54 controls the state of the DC-DC converter 10 so as to be changed from a state U1 to a state U2, a state U3, and a state U4 in this order, and then return to the state U1. In other words, the gate controller 54 performs control such that a cycle of the states U1 to U4 is repeated. FIG. 8 illustrates each of the states U1 to U4.

As illustrated in FIGS. 7 and 8, in the state U1, the lower MOSFET 31 is on, the upper MOSFET 32 is off, the lower MOSFET 33 is off, and the upper MOSFET 34 is off. Since the lower MOSFET 31 is on in the state U1, the current IL1 flows from the high potential input wiring 12 to the low potential wiring 16 through the main reactor 22, the first sub-reactor 24, and the lower MOSFET 31. During a period of the state U1, the induced voltages of the main reactor 22 and the first sub-reactor 24 (induced voltages that act in the direction opposing the current IL1) decrease, so the current IL1 gradually increases during the period of the state U1. Accordingly, the current IL also gradually increases. At an end of the period of the state U1, the lower MOSFET 31 is switched from the on state to the off state. The DC-DC converter 10 thereby transitions from the state U1 to the state U2.

When the lower MOSFET 31 is turned off at a start of a period of the state U2, the main reactor 22 and the first sub-reactor 24 generate induced voltages in the direction along which the current IL1 is kept flowing, so the potential of the anode of the diode 42 rises. Accordingly, the current IL1 flows from the high potential input wiring 12 to the high potential output wiring 14 through the main reactor 22, the first sub-reactor 24, and the diode 42. Such a flow of the current IL1 to the high potential output wiring 14 charges the output-side smoothing capacitor 50 (see FIG. 1) and raises the potential of the high potential output wiring 14. During the period of the state U2, the induced voltages of the main reactor 22 and the first sub-reactor 24 (induced voltages that act in the direction along which the current IL1 flows) decrease, so the current IL1 gradually decreases during the period of the state U2. Accordingly, the current IL also gradually decreases. In the zero-cross mode, the current IL1 (i.e., the current IL) decreases to zero during the period of the state U2. Since the upper MOSFET 32 is always off in the state U2, the current IL1 does not flow backward through the upper MOSFET 32. Therefore, once the current IL1 decreases to zero, the current IL1 is maintained at zero thereafter. At an end of the period of the state U2, the lower MOSFET 33 is switched from the off state to the on state. The DC-DC converter 10 thereby transitions from the state U2 to the state U3.

Since the lower MOSFET 33 is on in the state U3, the current IL2 flows from the high potential input wiring 12 to the low potential wiring 16 through the main reactor 22, the second sub-reactor 26, and the lower MOSFET 33. During a period of the state U3, the induced voltages of the main reactor 22 and the second sub-reactor 26 (induced voltages that act in the direction opposing the current IL2) decrease, so the current IL2 gradually increases during the period of the state U3. Accordingly, the current IL also gradually increases. At an end of the period of the state U3, the lower MOSFET 33 is switched from the on state to the off state. The DC-DC converter 10 thereby transitions from the state U3 to the state U4.

When the lower MOSFET 33 is turned off at a start of a period of the state U4, the main reactor 22 and the second sub-reactor 26 generate induced voltages in the direction along which the current IL2 is kept flowing, so the potential of the anode of the diode 44 rises. Accordingly, the current IL2 flows from the high potential input wiring 12 to the high potential output wiring 14 through the main reactor 22, the second sub-reactor 26, and the diode 44. Such a flow of the current IL2 to the high potential output wiring 14 charges the output-side smoothing capacitor 50 (see FIG. 1) and raises the potential of the high potential output wiring 14. During the period of the state U4, the induced voltages of the main reactor 22 and the second sub-reactor 26 (induced voltages that act in the direction along which the current IL2 flows) decrease, so the current IL2 gradually decreases during the period of the state U4. Accordingly, the current IL also gradually decreases. In the zero-cross mode, the current IL2 (i.e., the current IL) decreases to zero during the period of the state U4. Since the upper MOSFET 34 is always off in the state U4, the current IL2 does not flow backward through the upper MOSFET 34. Therefore, once the current IL2 decreases to zero, the current IL2 is maintained at zero thereafter. At an end of the period of the state U4, the lower MOSFET 31 is switched from the off state to the on state. The DC-DC converter 10 thereby transitions from the state U4 to the state U1.

As described above, in the first operation, the cycle of the states U1 to U4 is repeated plural times. The potential of the high potential output wiring 14 can thereby be raised.

Next, advantages of the first, second, and third operations will be described.

Figure 9:
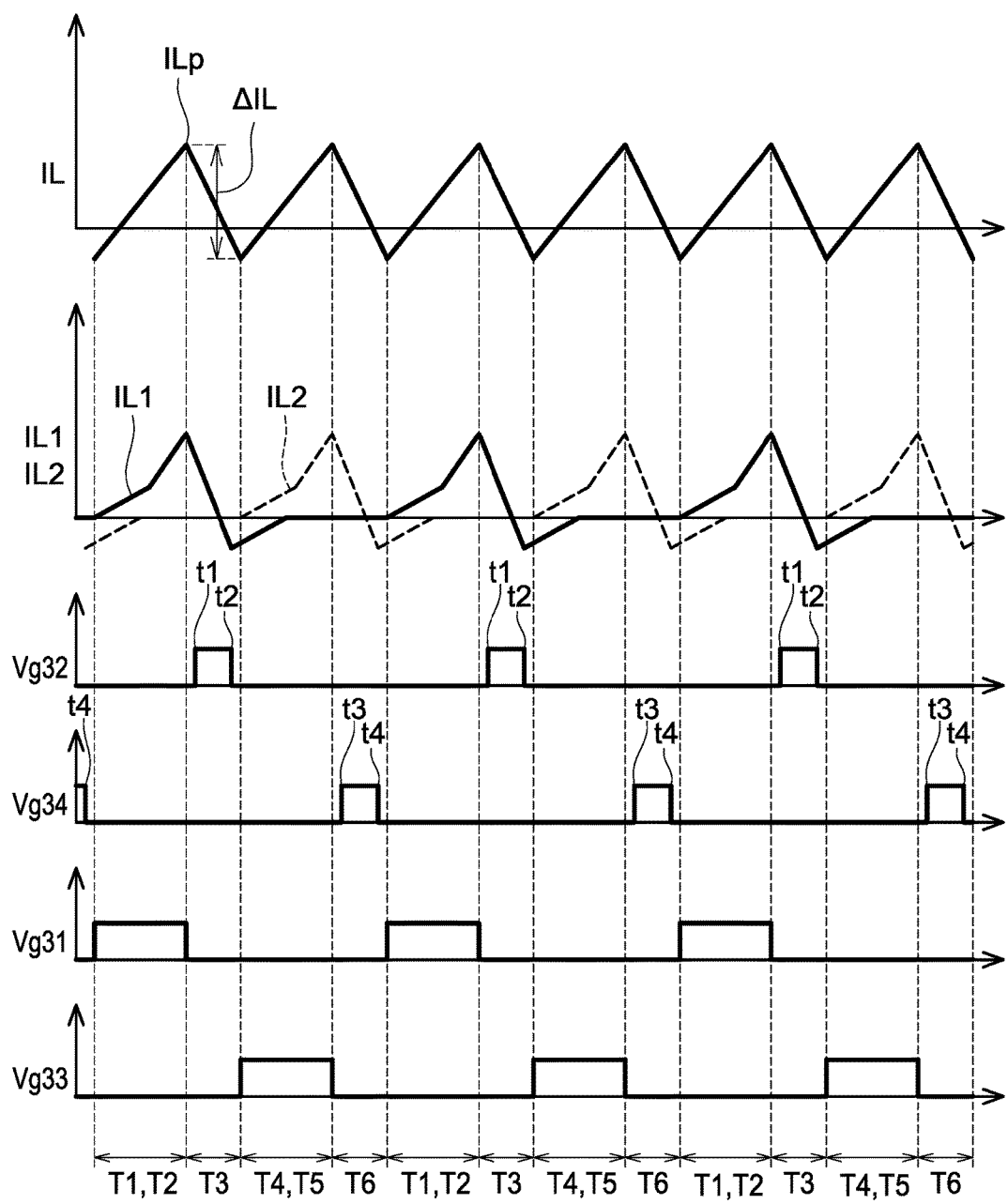
FIG. 9 is a graph illustrating changes in respective values in a case where the second operation is performed during the zero-cross mode.
Figure 10:
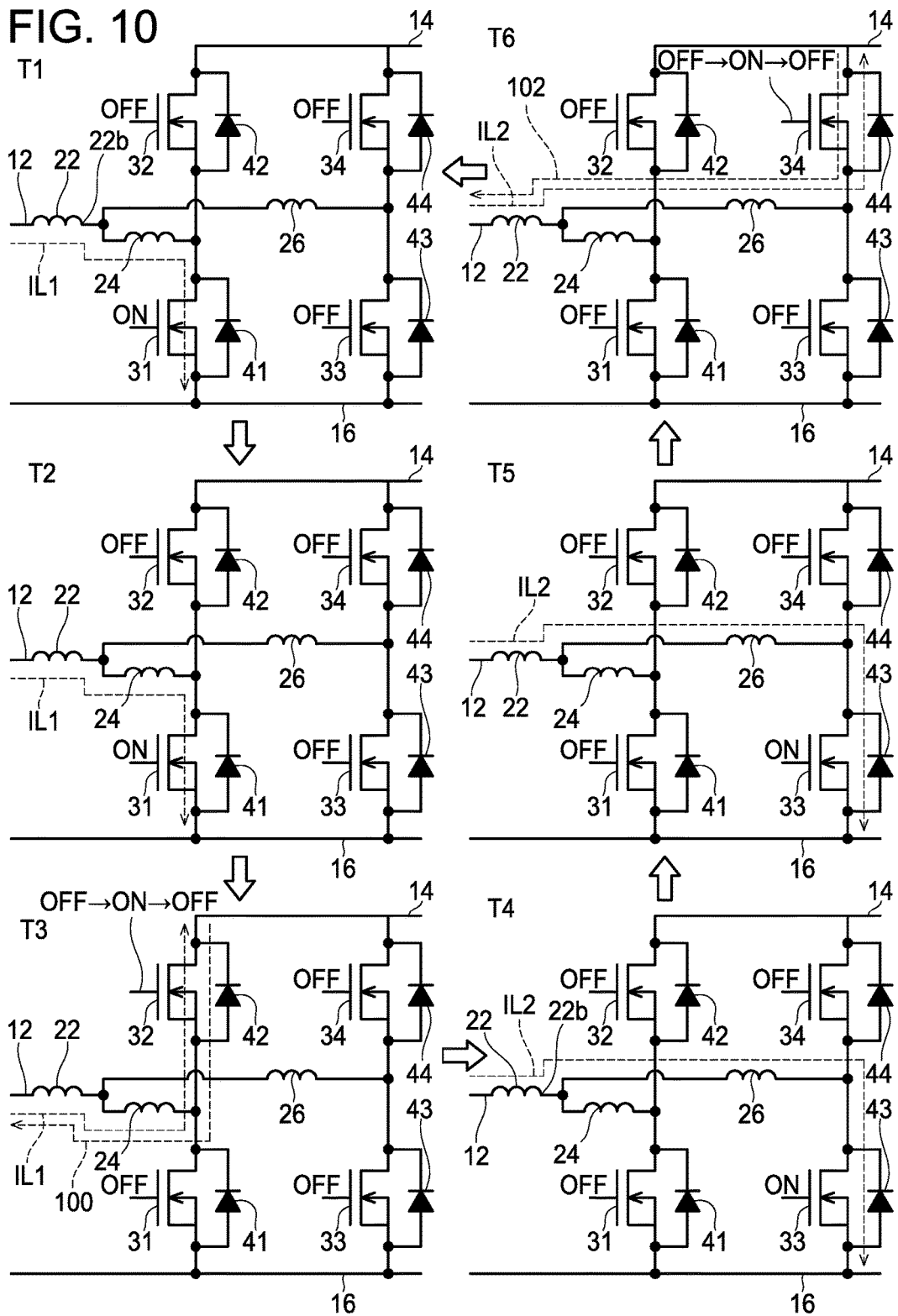
FIG. 10 is a diagram illustrating changes in the state of the DC-DC converter in the case where the second operation is performed during the zero-cross mode.

Initially, the advantage of the first operation over the second operation will be described. As aforementioned, the first operation is performed during the zero-cross mode. Although the second operation may be performed during the zero-cross mode, performing the first operation during the zero-cross mode can suppress a loss. FIGS. 9 and 10 illustrate a case where the second operation is performed during the zero-cross mode. If the second operation is performed during the zero-cross mode, the current IL1 decreases because the induced voltages of the main reactor 22 and the first sub-reactor 24 decrease during the period of the state T3. Since the upper MOSFET 32 is turned on during the period of the state T3, when the induced voltages decrease, the current IL1 flows backward through the upper MOSFET 32 as indicated by an arrow 100 in FIG. 10. Accordingly, as illustrated in FIG. 9, the current IL1 decreases below zero during the period of the state T3. Moreover, if the second operation is performed during the zero-cross mode, the current IL2 decreases because the induced voltages of the main reactor 22 and the second sub-reactor 26 decrease during the period of the state T6. Since the upper MOSFET 34 is turned on during the period of the state T6, when the induced voltages decrease, the current IL2 flows backward through the upper MOSFET 34 as indicated by an arrow 102 in FIG. 10. Accordingly, as illustrated in FIG. 9, the current IL2 decreases below zero during the period of the state T6.

In contrast to this, if the first operation is performed during the zero-cross mode, the backflows of the currents ILL IL2 as indicated by the arrows 100, 102 in FIG. 10 do not occur because the upper MOSFETs 32, 34 are constantly off. Therefore, as illustrated in FIG. 7, the currents ILL IL2 do not decrease below zero during the periods of the state U2 and the state U4. Accordingly, in the first operation, a loss caused by the backflows of the currents ILL IL2 is suppressed. More specifically, the following losses are suppressed.

Initially, as is clear from a comparison between FIG. 7 and FIG. 9, since the backflows of the currents ILL IL2 can be prevented in the first operation, an amplitude ΔIL of the current IL during the zero-cross mode is smaller than that in the second operation. Consequently, an AC loss that occurs in the main reactor 22 is small.

Moreover, as is clear from the comparison between FIG. 7 and FIG. 9, since the backflows of the currents ILL IL2 can be prevented in the first operation, a peak value ILp of the current IL during the zero-cross mode is smaller than that in the second operation. Consequently, a DC loss that occurs in the main reactor 22 is small.

Moreover, since the backflows of the currents IL1 IL2 are prevented in the first operation, a steady loss that occurs in the upper MOSFETs 32, 34 (steady loss caused by the backflows of the currents IL1 IL2) does not occur.

Moreover, since the upper MOSFETs 32, 34 are not switched in the first operation, no switching loss occurs in the upper MOSFETs 32, 34. Moreover, a loss caused by charging/discharging the gates of the upper MOSFETs 32, 34 does not occur, either.

As described above, performing the first operation during the zero-cross mode can prevent losses resulting from the backflows of the currents IL1, IL2.

Next, the advantage of the second operation over the first operation will be described. In the second operation, when the current IL1 flows through the diode 42, the current IL1 divides and also flows through the upper MOSFET 32, and when the current IL2 flows through the diode 44, the current IL2 divides and also flows through the upper MOSFET 34. In contrast to this, in the first operation, when the current IL1 flows through the diode 42, the current IL1 does not divide, and when the current IL2 flows through the diode 44, the current IL2 does not divide. In the second operation, it is possible to obtain a loss suppression effect by the division of current flow.

Since the currents IL1 IL2 themselves are small during the zero-cross mode, the loss suppression effect by the division of current flow is small. Therefore, during the zero-cross mode, performing the first operation can further suppress a loss as compared to a case of performing the second operation.

During the low-current mode, the currents IL1 IL2 do not flow backward, and the loss suppression by the division of current flow is effective. Therefore, performing the second operation can further suppress a loss as compared to a case of performing the first operation.

It should be noted, as illustrated in FIG. 7, in the first operation, the currents IL1 IL2 are zero and no energy is stored in each reactor on the timings of the turn-on of the lower MOSFETs 31, 33. Therefore, the currents IL1 IL2 rise at a low rate at the turn-on of the lower MOSFETs 31, 33, so a switching loss that occurs in the lower MOSFETs 31, 33 is extremely small.

Next, the advantage of the second operation over the third operation will be described. As illustrated in FIG. 5, the amplitude ΔIL of fluctuations in the current IL is small in the second operation. Accordingly, a loss that occurs in the main reactor 22 is small. Moreover, in the second operation, amplitudes ΔIL1, ΔIL2 of fluctuations in the currents IL1 IL2 are large. However, since the inductance of each of the first sub-reactor 24 and the second sub-reactor 26 is small, a loss that occurs in each of the first sub-reactor 24 and the second sub-reactor 26 is small. As such, in the second operation, a loss that occurs in each reactor can be suppressed.

Figure 11:
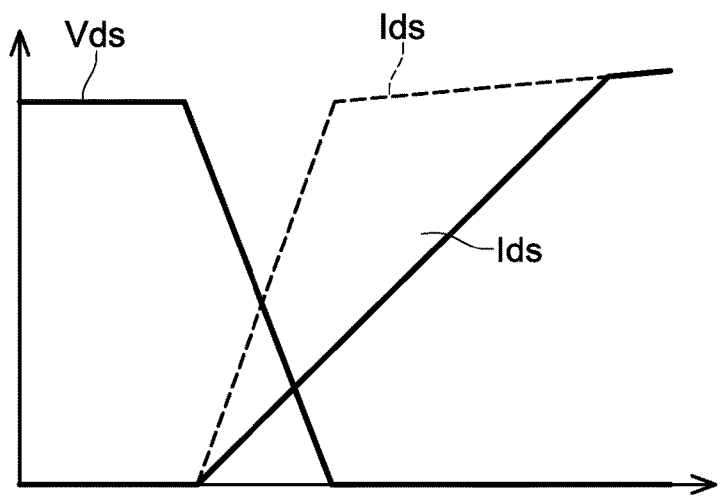
FIG. 11 is a graph illustrating changes in current and voltage at turn-on of a MOSFET.

Moreover, a switching loss at the turn-on of the lower MOSFETs 31, 33 can be suppressed in the second operation as compared to in the third operation. FIG. 11 illustrates changes in a drain-source voltage Vds and a drain-source current Ids at the turn-on of the lower MOSFETs 31, 33. It should be noted, in FIG. 11, a graph of the current Ids in a solid line illustrates change in the current Ids in the second operation, and a graph of the current Ids in a dashed line illustrates change in the current Ids in the third operation. In both of the second and third operations, the voltage Vds rapidly decreases and the current Ids rapidly increases when the lower MOSFETs 31, 33 is turned on. Moreover, in both of the second and third operations, the current Ids (i.e., the current IL1 or IL2) gradually increases after the turn-on of the lower MOSFETs 31, 33, as mentioned above.

As illustrated in FIG. 4, in the state (the state S4) immediately before the turn-on of the lower MOSFET 31 in the third operation, the current IL1 flows through the main reactor 22 and the first sub-reactor 24. Accordingly, at approximately the same time as the turn-on of the lower MOSFET 31, the current IL1 flows into the lower MOSFET 31 from the reactors 22, 24. Accordingly, as illustrated by the graph of the current Ids in the dashed line in FIG. 11, the current Ids increases at a high rate at the turn-on of the lower MOSFET 31 in the third operation. Therefore, in the third operation, a loss (a switching loss) that occurs at the turn-on of the lower MOSFET 31 is large. Similarly, in the third operation, a switching loss that occurs at the turn-on of the lower MOSFET 33 is large.

On the other hand, as illustrated in FIG. 6, in the state (the state T6) immediately before the turn-on of the lower MOSFET 31 in the second operation, the current IL1 does not flow through the first sub-reactor 24. Accordingly, although the current IL1 starts flowing through the lower MOSFET 31 at approximately the same time as the turn-on of the lower MOSFET 31, a rate at which the current IL1 increases is not so high. Accordingly, as illustrated by the graph of the current Ids in the solid line in FIG. 11, the current Ids increases at the turn-on of the lower MOSFET 31 at a lower rate in the second operation than in the third operation. Therefore, in the second operation, a switching loss that occurs at the turn-on of the lower MOSFET 31 is small. Similarly, in the second operation, a switching loss that occurs at the turn-on of the lower MOSFET 33 is small.

As described above, a switching loss that occurs in the lower MOSFETs 31, 33 can further be suppressed in the second operation than in the third operation.

Moreover, in both of the second and third operations, when the lower MOSFETs 31, 33 are turned on, the potentials of the anodes of the diodes 42, 44 decrease and a reverse voltage is applied to the diodes 42, 44. When the voltage applied to the diodes 42, 44 is switched from a forward voltage to a reverse voltage, a recovery current (a reverse current that flows for a short time) flows through the diodes 42, 44. When the recovery current flows, a recovery loss (a type of switching loss) occurs in the diodes 42, 44.

As illustrated in FIG. 4, in the third operation, the potentials of the anodes of the diodes 42, 44 are lowered from a high potential (a potential higher than that of the high potential output wiring 14) to a low potential (a potential of the low potential wiring 16) at the transition from the state S4 to the state S1. In other words, the voltage applied to the diodes 42, 44 is switched from a forward voltage to a reverse voltage. Accordingly, a recovery loss occurs in the diodes 42, 44.

On the other hand, as illustrated in FIG. 6, no current flows through the diode 42 at the turn-on of the lower MOSFET 31 (i.e., at the transition from the state T6 to the state T1) in the second operation, so no recovery loss occurs in the diode 42. Moreover, although the potential of the anode of the diode 44 is lowered via the first sub-reactor 24 and the second sub-reactor 26 when the lower MOSFET 31 is turned on, the potential of the anode of the diode 44 decreases at a low rate due to the influence of the induced voltages of the first sub-reactor 24 and the second sub-reactor 26. Therefore, a recovery loss hardly occurs in the diode 44 as well. Similarly, since no current flows through the diode 44 at the turn-on of the lower MOSFET 33 (i.e., at the transition from the state T3 to the state T4), no recovery loss occurs in the diode 44. In addition, since the potential of the anode of the diode 42 decreases slowly due to the influence of the induced voltages of the first sub-reactor 24 and the second sub-reactor 26, a recovery loss hardly occurs in the diode 42 as well.

As described above, a recovery loss (a type of switching loss) that occurs in the diodes 42, 44 can further be suppressed in the second operation than in the third operation.

Next, the advantage of the third operation over the second operation will be described. As mentioned above with reference to FIG. 6, in the second operation, only the lower MOSFET 31 is in the on state in the states T1, T2, and only the lower MOSFET 33 is in the on state in the states T4, T5. A steady loss $E_{on1}$ that occurs at the turn-on of only the lower MOSFET 31 (or 33) satisfies a relation of $E_{on1} \approx R_{on} IL^2$, where $R_{on}$ is an on-resistance of the lower MOSFET 31 (or 33). In contrast to this, as mentioned above with reference to FIG. 4, in the third operation, both of the lower MOSFETs 31, 33 are in the on state in the state S1, so the current IL divides to flow through the lower MOSFET 31 and the lower MOSFET 33. Therefore, a steady loss $E_{on2}$ that occurs at this time satisfies a relation of $E_{on2} \approx R_{on} (IL/2)^2 + R_{on}(IL/2)^2 = R_{on} IL^2/2$. That is, the steady loss $E_{on2}$ satisfies a relation of $E_{on2} \approx E_{on1}/2$. In other words, a steady loss is less likely to occur in the third operation than in the second operation.

As described above, a switching loss is further suppressed in the second operation than in the third operation, and a steady loss is further suppressed in the third operation than in the second operation. Since a ratio of a switching loss relative to a total loss is large during the low-current mode, performing the second operation during the low-current mode can reduce a loss. Moreover, since a ratio of a steady loss relative to the total loss is large during the high-current mode, performing the third operation during the high-current mode can reduce a loss.

Figure 12:
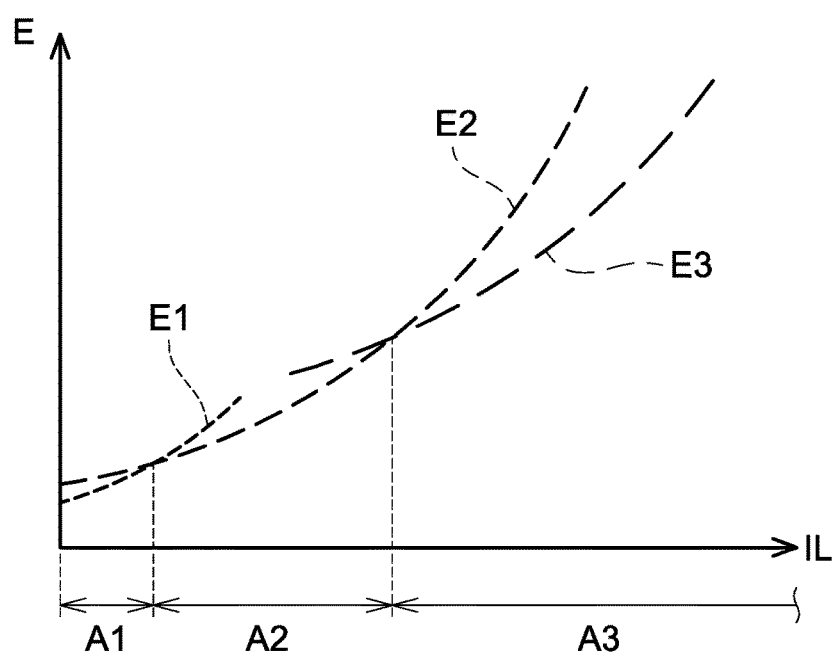
FIG. 12 is a graph illustrating a relation between a loss E and a current IL.

FIG. 12 illustrates a relation between a loss E and the current IL. It should be noted that the loss E illustrated in FIG. 12 indicates the total loss that occurs in the DC-DC converter 10. A graph E1 in FIG. 12 illustrates a loss that occurs in the first operation, a graph E2 in FIG. 12 illustrates a loss that occurs in the second operation, and the graph E3 in FIG. 12 illustrates a loss that occurs in the third operation. As mentioned above, the first operation can suppress a loss during the zero-cross mode (in a current region A1 in which the current IL is the lowest), the second operation can suppress a loss during the low-current mode (in a current region A2 in which the current IL is relatively low), and the third operation can suppress a loss during the high-current mode (in a current region A3 in which the current IL is high). Therefore, switching among the first, second, and third operations based on the current IL can suppress the loss that occurs in the DC-DC converter 10.

It should be noted, as mentioned above, when the current IL becomes high, the second operation (i.e., the operation in which the lower MOSFET 31 and the lower MOSFET 33 are alternately turned on) is switched to the third operation (i.e., the operation in which the lower MOSFET 31 and the lower MOSFET 33 are simultaneously turned on and off). When the second operation is switched to the third operation, an imbalance occurs between the current IL1 and the current IL2 (between the current IL1 and the current IL2 in the state S1 in FIG. 4). However, since the inductances of the first sub-reactor 24 and the second sub-reactor 26 are small, the current IL1 and the current IL2 are balanced within a short time after the start of the third operation. Therefore, the third operation can be performed without problem.

Second Embodiment

Next, a second embodiment will be described. A DC-DC converter of the second embodiment includes a circuit configuration identical to that of the DC-DC converter 10 of the first embodiment. The second embodiment differs from the first embodiment in its first operation performed during the zero-cross mode. Second and third operations of the second embodiment are the same as those of the first embodiment.

Figure 13:
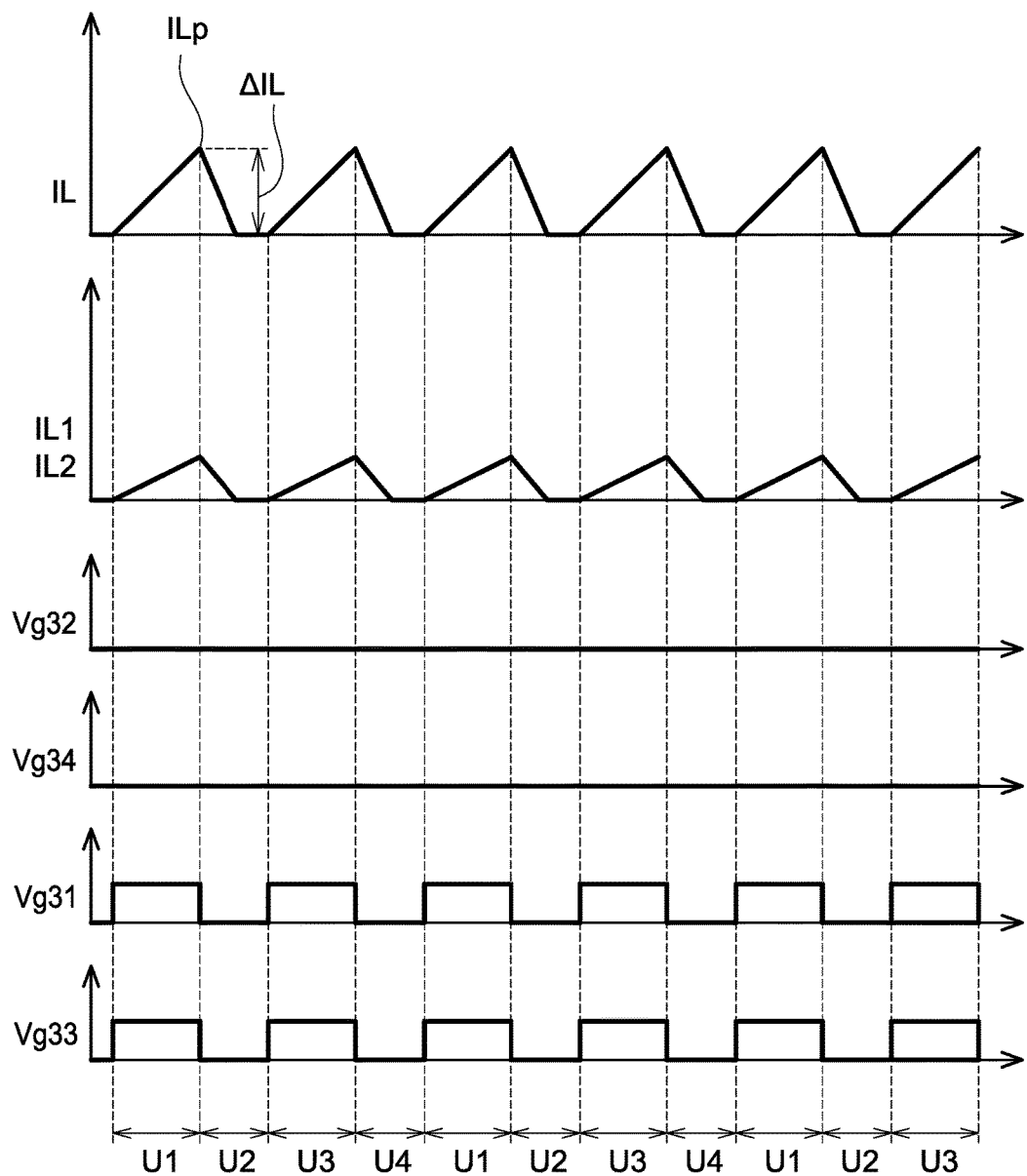
FIG. 13 is a graph illustrating changes in respective values in a first operation according to a second embodiment.
Figure 14:
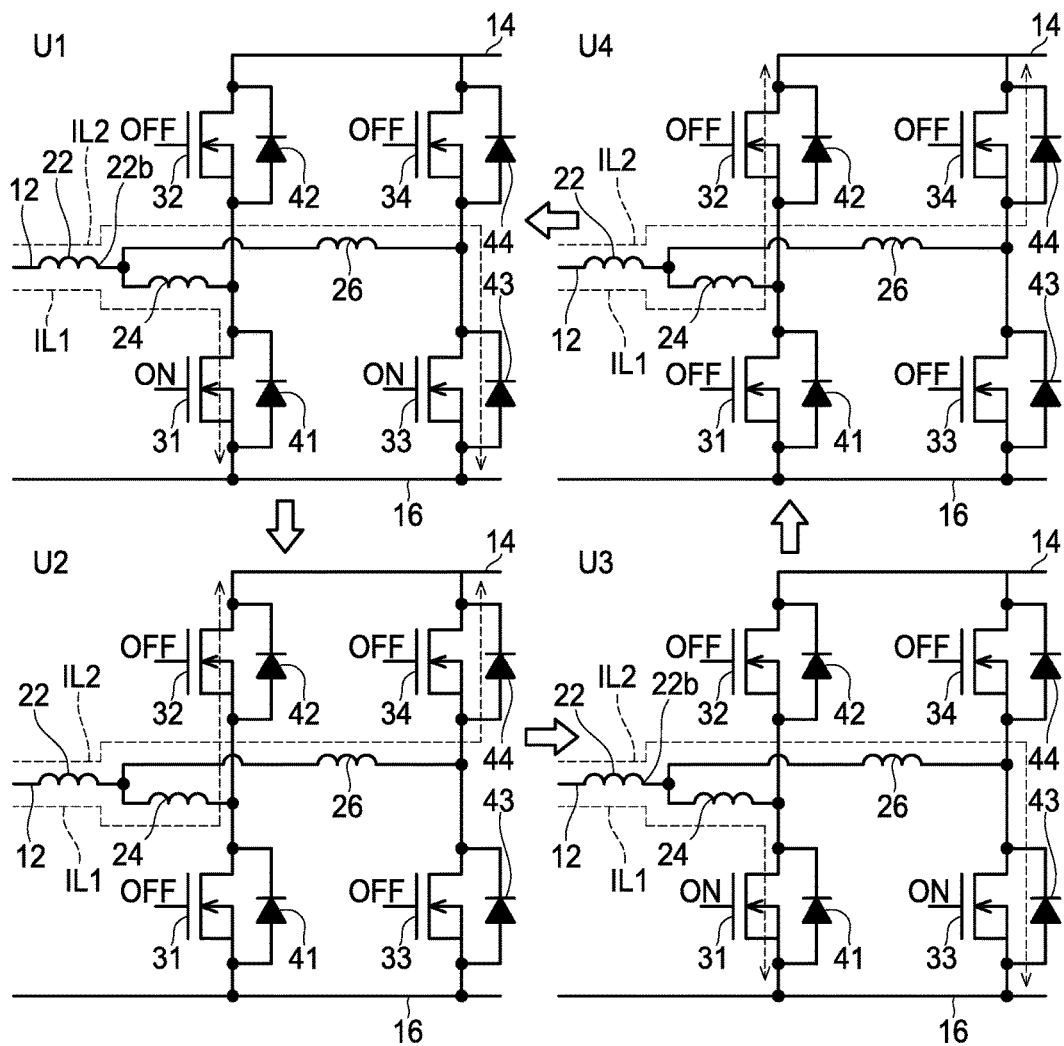
FIG. 14 is a diagram illustrating changes in a state of a DC-DC converter in the first operation according to the second embodiment.

FIGS. 13 and 14 illustrate a first operation of the second embodiment. It should be noted, in FIG. 13, the current IL1 coincides with the current IL2 (graphs are overlaid). In the second embodiment, in the state U1, the lower MOSFET 33 as well as the lower MOSFET 31 is turned on. Accordingly, during the period of the state U1, the current IL1 flows through the lower MOSFET 31, and additionally, the current IL2 flows through the lower MOSFET 33. Since the currents flow through the lower MOSFETs 31, 33 separately, the current density decreases, and so a steady loss is suppressed. Moreover, in the second embodiment, the lower MOSFET 31 as well as the lower MOSFET 33 is turned on in the state U3. Accordingly, during the period of the state U3, the current IL2 flows through the lower MOSFET 33, and additionally, the current IL1 flows through the lower MOSFET 31. Since the currents flow through the lower MOSFETs 31, 33 separately, the current density decreases, and so a steady loss is suppressed. Therefore, according to the configuration of the second embodiment, a steady loss during the zero-cross mode can further be reduced than in the first embodiment.

Third Embodiment

Figure 15:
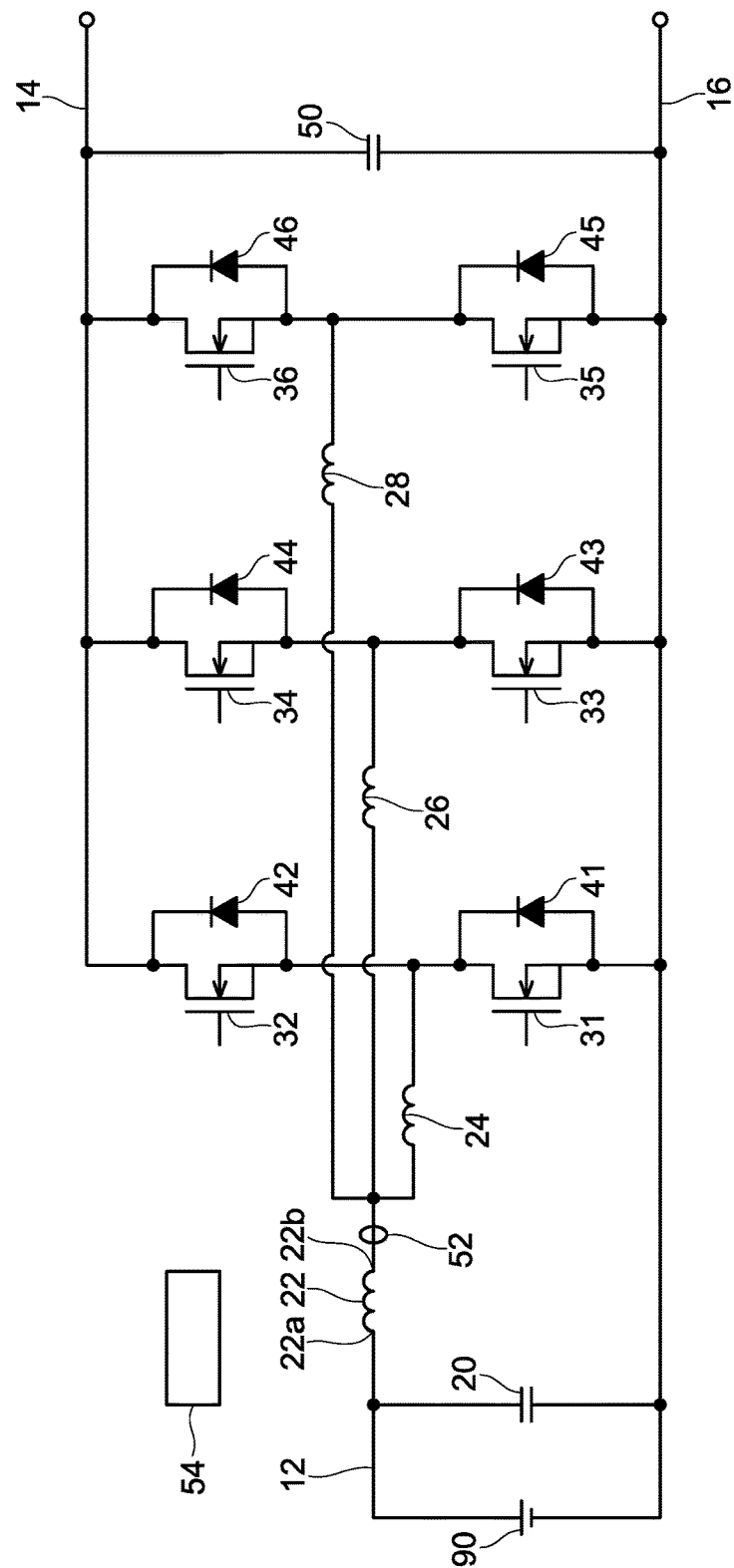
FIG. 15 is a circuit diagram of a DC-DC converter according to a third embodiment.
Figure 16:
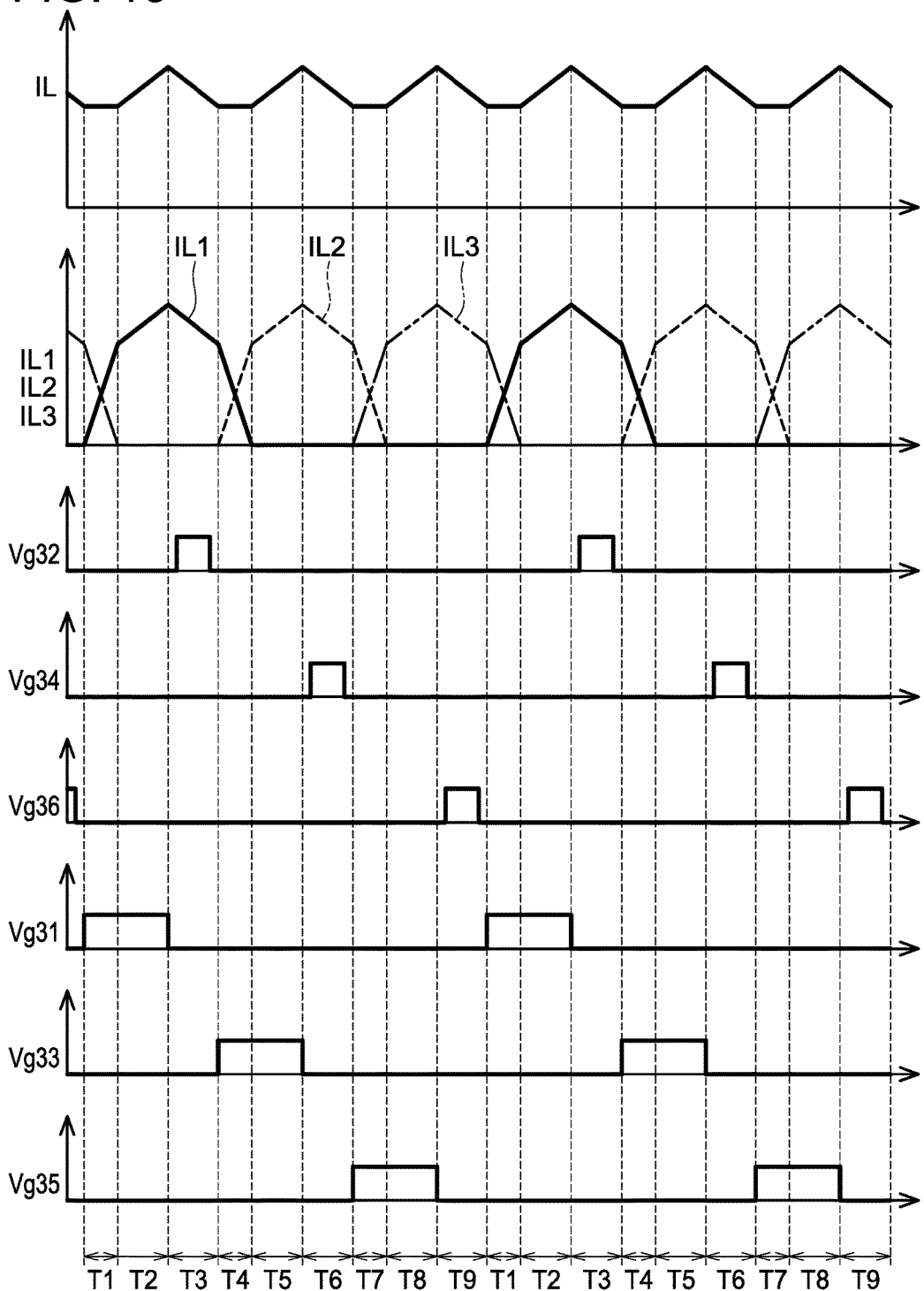
FIG. 16 is a graph illustrating changes in respective values in a second operation according to the third embodiment.
Figure 17:
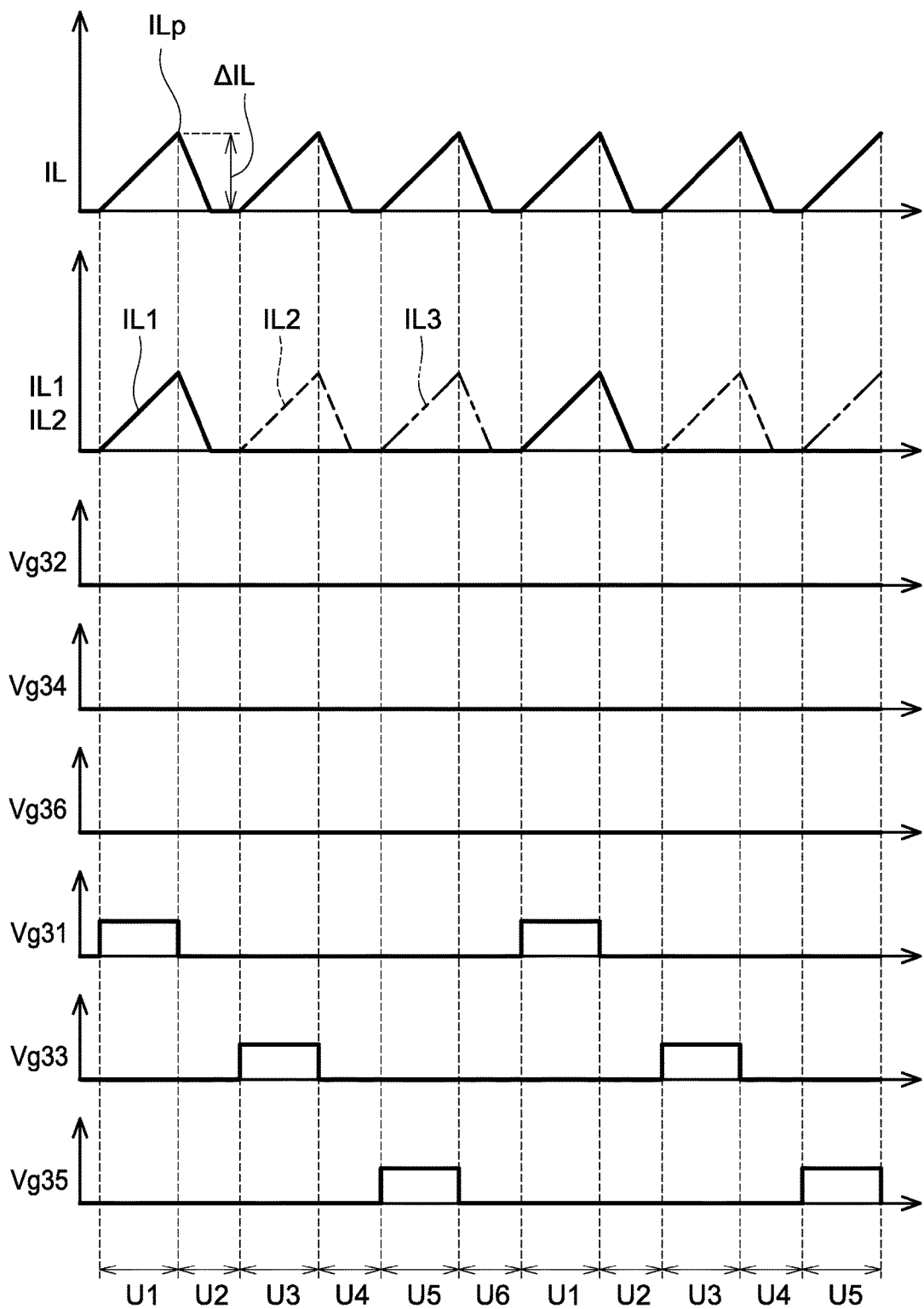
FIG. 17 is a graph illustrating changes in respective values in a first operation according to the third embodiment.

Next, a third embodiment will be described. In the third embodiment, as illustrated in FIG. 15, a lower MOSFET 35, a diode 45, an upper MOSFET 36, a diode 46, and a third sub-reactor 28 are added. The MOSFETs 35, 36 are of n-channel type. A source of the lower MOSFET 35 is connected to the low potential wiring 16, a source of the upper MOSFET 36 is connected to a drain of the lower MOSFET 35, and a drain of the upper MOSFET 36 is connected to the high potential output wiring 14. One end of the third sub-reactor 28 is connected to the second terminal 22b of the main reactor 22, and other end of the third sub-reactor 28 is connected to the drain of the lower MOSFET 35 and the source of the upper MOSFET 36. An anode of the diode 45 is connected to the source of the lower MOSFET 35, and a cathode of the diode 45 is connected to the drain of the lower MOSFET 35. An anode of the diode 46 is connected to the source of the upper MOSFET 36, and a cathode of the diode 46 is connected to the drain of the upper MOSFET 36. In this case, as illustrated in FIG. 16, the state of the DC-DC converter 10 can be controlled so as to be changed from state T1 to T9 in this order, and then return to the state T1 in the second operation. In other words, a cycle of the states T1 to T9 may be performed repeatedly. Moreover, as illustrated in FIG. 17, a cycle of states U1 to U6 may be performed repeatedly in the first operation. It should be noted, in FIGS. 16 and 17, a current IL3 is a current flowing through the third sub-reactor 28, a potential Vg35 is a gate potential of the lower MOSFET 35, and a potential Vg36 is a gate potential of the upper MOSFET 36. Even when the number of series circuits each including an upper MOSFET and a lower MOSFET is three, the first and second operations can be performed. Moreover, in periods of the states U1, U3, U5 in FIG. 17, the lower MOSFETs 31, 33, and 35 may be turned on. Moreover, the number of the series circuits each including an upper MOSFET and a lower MOSFET may further be increased as compared to the number illustrated in FIG. 15.

In the embodiments mentioned above, the current sensor 52 measures the current IL flowing through the main reactor 22. However, a current sensor that detects a current flowing through another position (e.g., at least one of the high potential input wiring 12, the first sub-reactor 24, the second sub-reactor 26, the MOSFETs 31 to 34, and the diodes 41 to 44) may be provided, and the current IL may be estimated from a detection value from the current sensor, and the first and second operations may be switched based thereon.

In the embodiments mentioned above, as illustrated in FIG. 4, the lower MOSFETs 31, 33 and the upper MOSFETs 32, 34 are alternately turned on in the third operation. However, in the third operation, the state S1 and the state S2 may be appear alternately, and the upper MOSFETs 32, 34 may be maintained in the off state.

Relations between constituent features in the embodiments and constituent features in the claims will be described. The lower MOSFET 31 in the embodiments is an example of a first lower FET in the claims. The upper MOSFET 32 in the embodiments is an example of a first upper FET in the claims. The lower MOSFET 33 in the embodiments is an example of a second lower FET in the claims. The upper MOSFET 34 in the embodiments is an example of a second upper FET in the claims. The diode 42 in the embodiments is an example of a first diode in the claims. The diode 44 in the embodiments is an example of a second diode in the claims. The state U1 in FIG. 7, 13, or 17 is an example of a first state in the claims. The state U2 in FIG. 7, 13, or 17 is an example of a second state in the claims. The state U3 in FIG. 7, 13, or 17 is an example of a third state in the claims. The state U4 in FIG. 7, 13, or 17 is an example of a fourth state in the claims. The states T1, T2 in FIG. 5 or 16 are an example of a fifth state in the claims. The state T3 in FIG. 5 or 16 is an example of a sixth state in the claims. The states T4, T5 in FIG. 5 or 16 are an example of a seventh state in the claims. The state T6 in FIG. 5 or 16 is an example of an eighth state in the claims.

Some of the technical features described herein will be listed below. It should be noted that the respective technical elements are independent of one another, and are useful solely or in combinations.

In an example of DC-DC converter disclosed herein, the second lower FET may be on in the first state, and the first lower FET may be on in the third state.

In this configuration, the first and second lower FETs are on in the first state, and the first and second lower FETs are on in the third state. During the zero-cross mode, the lower FETs are turned on with a current that flows through the main reactor being approximately zero. Accordingly, even if the first and second lower FETs are turned on, a switching loss hardly occurs. Moreover, turning on the first and second lower FETs divides a current and can reduce a steady loss.

In an example of DC-DC converter disclosed herein, the second lower FET may be off in the first state, and the first lower FET may be off in the third state.

In this configuration, the lower FETs operate approximately equally in the first and second operations, so control is facilitated.

In an example of DC-DC converter disclosed herein, the gate controller may be configured to perform the second operation and a third operation based on the variable current in the non-zero-cross mode. The gate controller may be configured to perform the second operation during a low current mode in which the variable current is lower than a reference value, and to perform the third operation during a high current mode in which the variable current is equal to or higher than the reference value. In the third operation, the gate controller may control the first lower FET and the second lower FET so as to satisfy a condition that a state in which the first lower FET and the second lower FET are on and a state in which the first lower FET and the second lower FET are off repeatedly appear alternately. Further, the gate controller may control the lower FETs and the upper FETs such that the first upper FET is off when the first lower FET is on, and the second upper FET is off when the second lower FET is on.

According to this configuration, during the high-current mode in which a steady loss is likely to occur, a current can divide to the first and second lower FETs. Accordingly, a steady loss can be reduced.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A DC-DC converter, comprising:
   a high potential input wiring connected to a positive electrode of a direct current source;
   a high potential output wiring;
   a low potential wiring connected to a negative electrode of the direct current source;
   a first lower FET of n-channel type, a source of the first lower FET being connected to the low potential wiring;
   a first upper FET of n-channel type, a source of the first upper FET being connected to a drain of the first lower FET, and a drain of the first upper FET being connected to the high potential output wiring;
   a second lower FET of n-channel type, a source of the second lower FET being connected to the low potential wiring;
   a second upper FET of n-channel type, a source of the second upper FET being connected to a drain of the second lower FET, and a drain of the second upper FET being connected to the high potential output wiring;
   a first diode, an anode of the first diode being connected to the source of the first upper FET, and a cathode of the first diode being connected to the drain of the first upper FET;
   a second diode, an anode of the second diode being connected to the source of the second upper FET, and a cathode of the second diode being connected to the drain of the second upper FET;
   a main reactor comprising a first terminal and a second terminal, the first terminal being connected to the high potential input wiring;
   a first sub-reactor, one end of the first sub-reactor being connected to the second terminal of the main reactor, and other end of the first sub-reactor being connected to the drain of the first lower FET;
a second sub-reactor, one end of the second sub-reactor being connected to the second terminal of the main reactor, and other end of the second sub-reactor being connected to the drain of the second lower FET; and
a gate controller connected to a gate of the first lower FET, a gate of the first upper FET, a gate of the second lower FET, and a gate of the second upper FET, wherein
the gate controller is configured to perform a first operation and a second operation based on a variable current flowing through the main reactor,
the gate controller is configured to perform the first operation during a zero-cross mode in which the variable current decreases to zero, and to perform the second operation during a non-zero-cross mode in which the variable current does not decrease to zero,
in the first operation, the gate controller controls the first lower FET, the first upper FET, the second lower FET, and the second upper FET so as to satisfy following conditions:
a first state, a second state, a third state, and a fourth state repeatedly appear in this order, the first state being a state in which the first lower FET is on, the second state being a state in which the first lower FET and the second lower FET are off, the third state being a state in which the second lower FET is on, and the fourth state being a state in which the first lower FET and the second lower FET are off; and
the first upper FET and the second upper FET are not turned on,
in the second operation, the gate controller controls the first lower FET, the first upper FET, the second lower FET, and the second upper FET so as to satisfy following conditions:
a fifth state, a sixth state, a seventh state, and an eighth state repeatedly appear in this order, the fifth state being a state in which the first lower FET is on and the second lower FET is off, the sixth state being a state in which the first lower FET and the second lower FET are off, the seventh state being a state in which the first lower FET is off and the second lower FET is on, and the eighth state being a state in which the first lower FET and the second lower FET are off; and
the first upper FET is turned on in at least a part of a period of the sixth state, and the second upper FET is turned on in at least a part of a period of the eighth state.

2. The DC-DC converter of claim 1, wherein the second lower FET is on in the first state, and the first lower FET is on in the third state.

3. The DC-DC converter of claim 1, wherein the second lower FET is off in the first state, and the first lower FET is off in the third state.

4. The DC-DC converter of claim 1, wherein
the gate controller is configured to perform the second operation and a third operation based on the variable current in the non-zero-cross mode,
the gate controller is configured to perform the second operation during a low current mode in which the variable current is lower than a reference value, and to perform the third operation during a high current mode in which the variable current is equal to or higher than the reference value,
in the third operation, the gate controller controls the first lower FET and the second lower FET so as to satisfy a condition that a state in which the first lower FET and the second lower FET are on and a state in which the first lower FET and the second lower FET are off repeatedly appear alternately.

* * * * *